(12) United States Patent
Kim et al.

(10) Patent No.: US 12,199,002 B2
(45) Date of Patent: Jan. 14, 2025

(54) SEMICONDUCTOR PACKAGE AND METHOD OF MANUFACTURING THE SAME

(71) Applicant: Samsung Electronics Co., Ltd., Suwon-si (KR)

(72) Inventors: Taehwan Kim, Hwaseong-si (KR); Kyungsuk Oh, Seongnam-si (KR); Jaechoon Kim, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 275 days.

(21) Appl. No.: 17/736,500

(22) Filed: May 4, 2022

(65) Prior Publication Data
US 2023/0092410 A1 Mar. 23, 2023

(30) Foreign Application Priority Data
Sep. 17, 2021 (KR) ........................ 10-2021-0124643

(51) Int. Cl.
*H01L 21/00* (2006.01)
*H01L 23/00* (2006.01)
(Continued)

(52) U.S. Cl.
CPC .......... *H01L 23/367* (2013.01); *H01L 23/481* (2013.01); *H01L 23/5226* (2013.01);
(Continued)

(58) Field of Classification Search
CPC .. H01L 23/367; H01L 23/481; H01L 23/5226
See application file for complete search history.

(56) References Cited

U.S. PATENT DOCUMENTS 5,239,200 A * 8/1993 Messina ................ H01L 23/473
361/689
6,257,320 B1 * 7/2001 Wargo .................. H01L 23/473
174/15.1
(Continued)

FOREIGN PATENT DOCUMENTS

| CN | 100416862 C | * | 9/2008 | ............. H01L 29/66 |
| CN | 106030898 A | * | 10/2016 | ............. F25B 21/02 |

(Continued)

*Primary Examiner* — Laura M Menz
(74) *Attorney, Agent, or Firm* — Muir Patent Law, PLLC

(57) ABSTRACT

A semiconductor package includes a first semiconductor chip including first through electrodes and having a first hot zone in which the first through electrodes are disposed; a heat redistribution chip disposed on the first semiconductor chip, having a cool zone overlapping the first hot zone in a stacking direction with respect to the first semiconductor chip, and including first heat redistribution through electrodes disposed outside of an outer boundary of the cool zone and electrically connected to the first through electrodes, respectively; a second semiconductor chip disposed on the heat redistribution chip, having a second hot zone overlapping the cool zone in the stacking direction, and including second through electrodes disposed in the second hot zone and electrically connected to the first heat redistribution through electrodes, respectively; and a first thermal barrier layer disposed between the first hot zone and the cool zone, wherein the first through electrodes are electrically connected to the second through electrodes by bypassing the cool zone via the first heat redistribution through electrodes.

15 Claims, 21 Drawing Sheets

(51) Int. Cl.
*H01L 23/367* (2006.01)
*H01L 23/48* (2006.01)
*H01L 23/522* (2006.01)
*H01L 25/04* (2023.01)

(52) U.S. Cl.
CPC .............. *H01L 24/16* (2013.01); *H01L 25/04* (2013.01); *H01L 24/32* (2013.01); *H01L 24/73* (2013.01); *H01L 2224/16145* (2013.01); *H01L 2224/32145* (2013.01); *H01L 2224/73204* (2013.01)

(56) References Cited

U.S. PATENT DOCUMENTS

| | | | |
|---|---|---|---|
| 6,796,370 B1 * | 9/2004 | Doll | H01L 23/473 257/E23.098 |
| 6,986,382 B2 * | 1/2006 | Upadhya | F28D 15/0266 174/15.1 |
| 8,310,046 B2 | 11/2012 | Baek et al. | |
| 8,829,670 B1 * | 9/2014 | Zhang | H01L 21/4871 257/713 |
| 8,963,317 B2 | 2/2015 | Lin | |
| 8,987,010 B1 * | 3/2015 | Ayotte | H01L 22/12 438/16 |
| 10,741,468 B2 | 8/2020 | Groothuis et al. | |
| 10,978,427 B2 | 4/2021 | Li et al. | |
| 11,109,515 B1 * | 8/2021 | Nagarajan | H04Q 11/0005 |
| 11,444,060 B2 * | 9/2022 | Han | H01L 23/3121 |
| 11,574,851 B2 * | 2/2023 | Uppal | H01L 23/3677 |
| 11,574,873 B2 * | 2/2023 | Seo | H01L 23/367 |
| 11,587,859 B2 * | 2/2023 | Park | H01L 24/81 |
| 11,923,342 B2 * | 3/2024 | Han | H01L 21/6835 |
| 2008/0048335 A1 | 2/2008 | Han | |
| 2010/0044856 A1 | 2/2010 | Sri-Jayantha et al. | |
| 2012/0007229 A1 | 1/2012 | Bartley et al. | |
| 2013/0150790 A1 * | 6/2013 | Palmieri | A61M 5/142 417/322 |
| 2015/0064813 A1 * | 3/2015 | Ayotte | G06T 7/001 438/16 |
| 2017/0344309 A1 | 11/2017 | Balakrishnan et al. | |
| 2018/0261528 A1 | 9/2018 | Chen et al. | |
| 2018/0286844 A1 | 10/2018 | Dogruoz et al. | |
| 2019/0148256 A1 | 5/2019 | Jung et al. | |
| 2020/0273772 A1 * | 8/2020 | Uppal | H01L 23/4334 |
| 2021/0013181 A1 * | 1/2021 | Han | H01L 23/3121 |
| 2021/0193581 A1 * | 6/2021 | Seo | H01L 23/5384 |
| 2022/0051970 A1 * | 2/2022 | Park | H01L 24/81 |
| 2022/0170386 A1 * | 6/2022 | O'Donnell | F22B 29/06 |
| 2022/0170387 A1 * | 6/2022 | O'Donnell | C25B 1/042 |
| 2022/0170388 A1 * | 6/2022 | O'Donnell | B63H 11/00 |
| 2022/0216186 A1 * | 7/2022 | Han | H01L 25/0657 |
| 2023/0005835 A1 * | 1/2023 | Song | H01L 23/49894 |
| 2023/0065314 A1 * | 3/2023 | Veches | H10N 10/17 |
| 2023/0092410 A1 * | 3/2023 | Kim | H01L 23/481 257/668 |
| 2023/0154816 A1 * | 5/2023 | Haba | H01L 25/0655 257/713 |
| 2023/0154828 A1 * | 5/2023 | Haba | H01L 23/473 257/714 |
| 2023/0154910 A1 * | 5/2023 | Chung | H01L 24/03 257/680 |
| 2023/0170304 A1 * | 6/2023 | Seo | H01L 24/17 257/737 |
| 2023/0178533 A1 * | 6/2023 | Jeon | H01L 23/3157 257/738 |
| 2023/0197559 A1 * | 6/2023 | Haba | H01L 25/0657 361/719 |
| 2023/0197560 A1 * | 6/2023 | Katkar | H01L 23/38 257/467 |
| 2024/0006262 A1 * | 1/2024 | Mun | H01L 23/5385 |
| 2024/0071995 A1 * | 2/2024 | Kang | H01L 24/80 |
| 2024/0170440 A1 * | 5/2024 | Choi | H01L 24/16 |
| 2024/0186290 A1 * | 6/2024 | Kim | H01L 23/3128 |

FOREIGN PATENT DOCUMENTS

| | | | | |
|---|---|---|---|---|
| CN | 113035800 A | * | 3/2021 | ............ H01L 21/52 |
| CN | 115831885 A | * | 3/2023 | ........... H01L 23/367 |
| KR | 100807050 B1 | | 2/2008 | |
| KR | 1020190056190 A | | 5/2019 | |
| TW | 202333319 A | * | 8/2023 | ......... H01L 23/3672 |
| TW | 202412219 A | * | 3/2024 | ....... H01L 23/49827 |
| WO | WO-2023091430 A1 | * | 5/2023 | ............ H01L 23/36 |
| WO | WO-2023091485 A1 | * | 5/2023 | ........... H01L 21/187 |

* cited by examiner

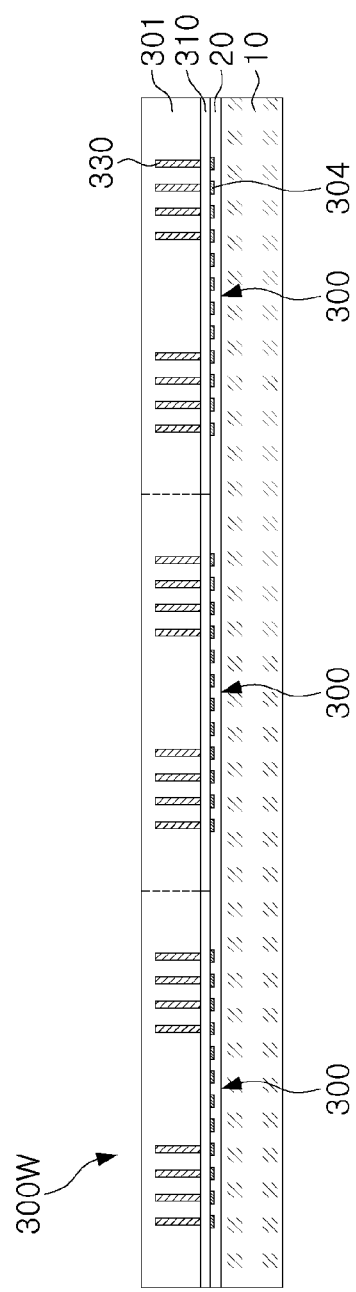
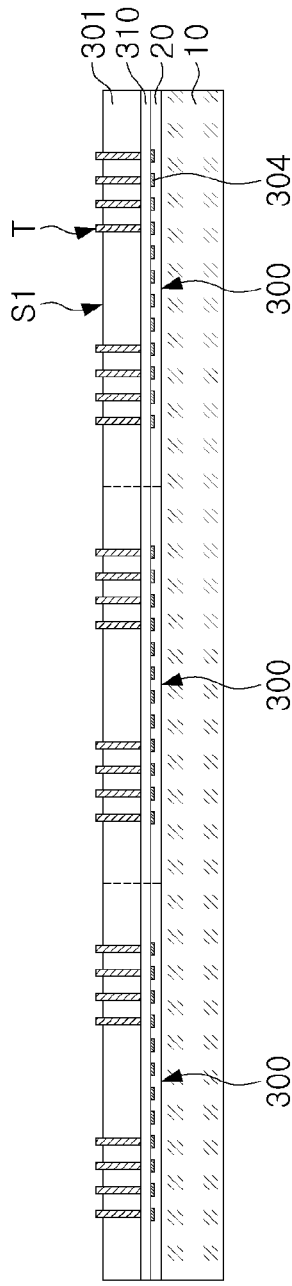
FIG. 9A
FIG. 9B

SEMICONDUCTOR PACKAGE AND METHOD OF MANUFACTURING THE SAME

CROSS TO REFERENCE TO RELATED APPLICATION(S)

This application claims benefit of priority to Korean Patent Application No. 10-2021-0124643 filed on Sep. 17, 2021 in the Korean Intellectual Property Office, the disclosure of which is incorporated herein by reference in its entirety.

BACKGROUND

Example embodiments of the present disclosure relate to a semiconductor package and a method of manufacturing the same.

In accordance with the recent trend for miniaturization and high performance in semiconductor packages, semiconductor packages in which semiconductor chips are stacked in multiple layers have been developed. In semiconductor chips communicating at high speed through through-electrodes (e.g., TSV), however, hotspots may be formed in a region in which the through-electrodes are densely disposed, which may deteriorate performance of the semiconductor chips. Accordingly, a semiconductor package technique reducing the temperature of the stacked hot spots has been desired.

SUMMARY

An example embodiment of the present disclosure is to provide a semiconductor package having improved heat dissipation properties, and a method of manufacturing the same.

According to an example embodiment of the present disclosure, a semiconductor package includes a first semiconductor chip including first through electrodes and having a first hot zone in which the first through electrodes are disposed; a heat redistribution chip disposed on the first semiconductor chip, having a cool zone overlapping the first hot zone in a stacking direction with respect to the first semiconductor chip, and including first heat redistribution through electrodes disposed outside of an outer boundary of the cool zone and electrically connected to the first through electrodes, respectively; a second semiconductor chip disposed on the heat redistribution chip, having a second hot zone overlapping the cool zone in the stacking direction, and including second through electrodes disposed in the second hot zone and electrically connected to the first heat redistribution through electrodes, respectively; and a first thermal barrier layer disposed between the first hot zone and the cool zone, wherein the first through electrodes are electrically connected to the second through electrodes by bypassing the cool zone via the first heat redistribution through electrodes.

According to an example embodiment of the present disclosure, a semiconductor package includes a first semiconductor chip including first through electrodes and having a first hot zone in which the first through electrodes are disposed; a heat distribution chip disposed on the first semiconductor chip, having a cool zone overlapping the first hot zone in a stacking direction with respect to the first semiconductor chip, and including intermediate through electrodes disposed outside of an outer boundary of the cool zone and electrically connected to the first through electrodes, respectively; a second semiconductor chip disposed on the heat distribution chip, having a second hot zone overlapping the cool zone in the stacking direction, and including second through electrodes disposed in the second hot zone and electrically connected to the intermediate electrodes, respectively; and an encapsulant disposed on the first semiconductor chip and encapsulating at least a portion of each of the heat distribution chip and the second semiconductor chip, wherein no through electrodes are disposed in the cool zone.

According to an example embodiment of the present disclosure, a semiconductor package includes a first semiconductor chip having a first zone in which first through electrodes are densely disposed; a dummy chip disposed on the first semiconductor chip, having a second zone overlapping the first zone in a stacking direction with respect to the first semiconductor chip, and including first and second electrodes disposed on an external side of the second zone; a second semiconductor chip disposed on the dummy chip, having a third zone overlapping the second zone in the stacking direction, and including second through electrodes densely disposed in the third zone; and a thermal barrier layer disposed between the hot zone and the second zone, wherein the first and second through electrodes are electrically connected to each other via the first electrodes, and wherein the second electrodes are electrically insulated from the first and second through electrodes.

According to an example embodiment of the present disclosure, a method of manufacturing a semiconductor package includes preparing a semiconductor wafer for first semiconductor chips each having a first hot zone in which first through electrodes are densely disposed; forming a first adhesive film layer on a lower surface of a dummy chip to be stacked on the semiconductor wafer, where the dummy chip has a cool zone in which dummy electrodes are not disposed, and the first adhesive film layer has a thermal barrier layer formed in a position corresponding to the cool zone; attaching the dummy chip to the semiconductor wafer, where the first hot zone overlaps the cool zone in a stacking direction of the semiconductor wafer and the dummy chip; forming a second adhesive film layer on a lower surface of a second semiconductor chip to be stacked on the dummy chip, where the second semiconductor chip has a second hot zone in which second through electrodes are densely disposed; and attaching the second semiconductor chip to the dummy chip, where the second hot zone overlaps the first hot zone and the cool zone in the stacking direction.

BRIEF DESCRIPTION OF DRAWINGS

The above and other aspects, features, and advantages of the present disclosure will be more clearly understood from the following detailed description, taken in conjunction with the accompanying drawings, in which:

FIGS. 9A to 9C are cross-sectional diagrams illustrating a method of manufacturing a dummy chip according to an example embodiment of the present disclosure;

DETAILED DESCRIPTION

Hereinafter, example embodiments of the present disclosure will be described as follows with reference to the accompanying drawings.

Figure 1A:
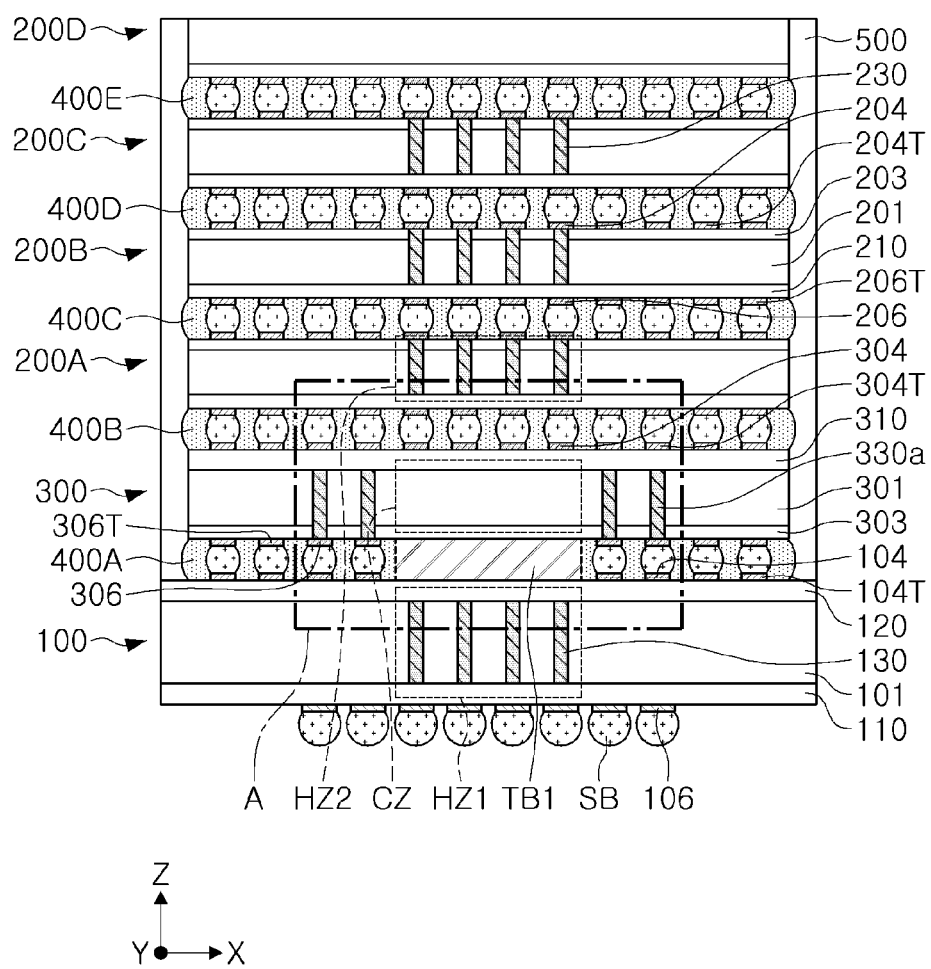
FIG. 1A is a cross-sectional diagram illustrating a semiconductor package according to an example embodiment of the present disclosure.
Figure 1B:
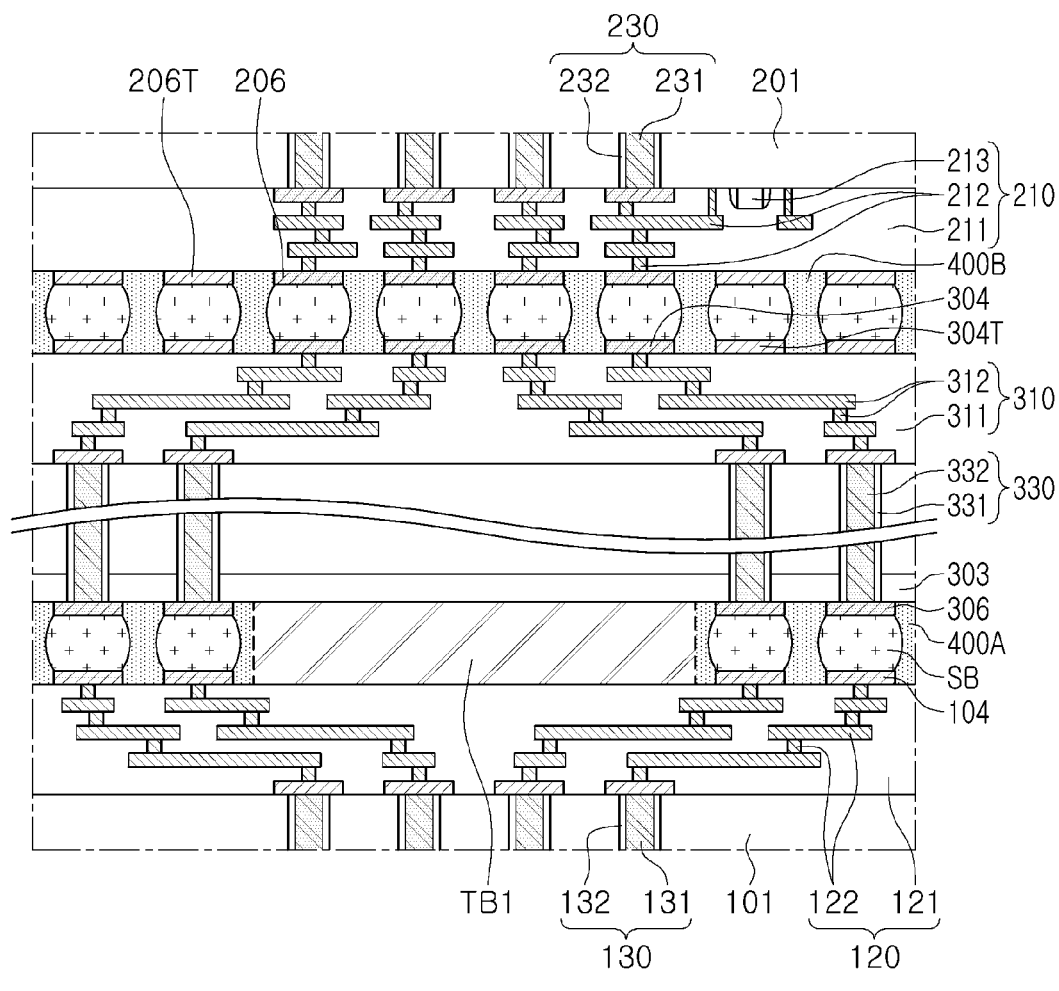
FIG. 1B is an enlarged diagram illustrating region "A" in FIG. 1A.
Figure 2A:
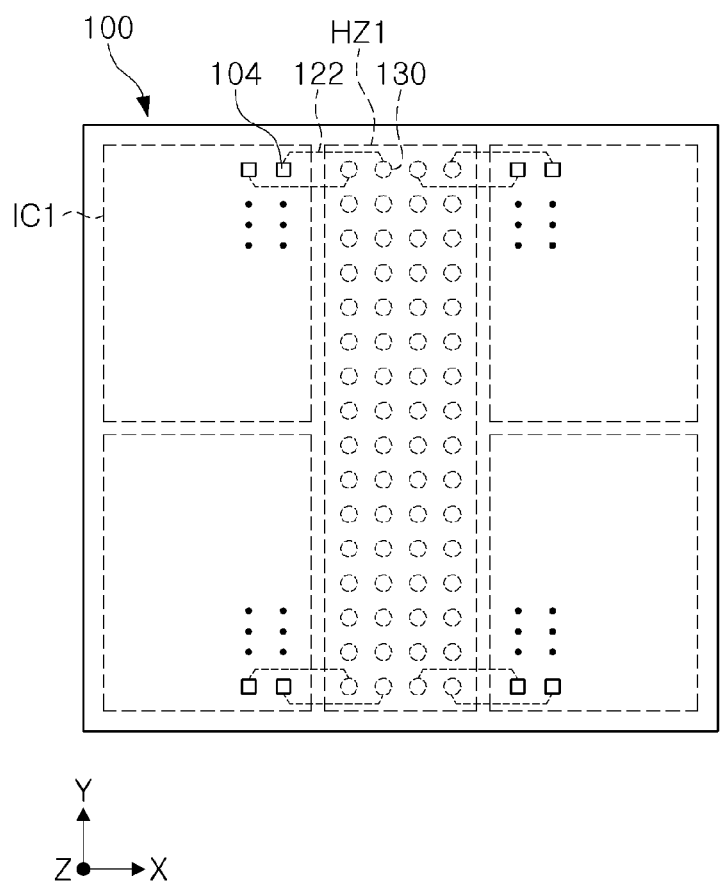
FIGS. 2A to 2C are plan diagrams illustrating a first semiconductor chip, a dummy chip, and a second semiconductor chip in FIG. 1A, according to an example embodiment.
Figures 2B, 2C:
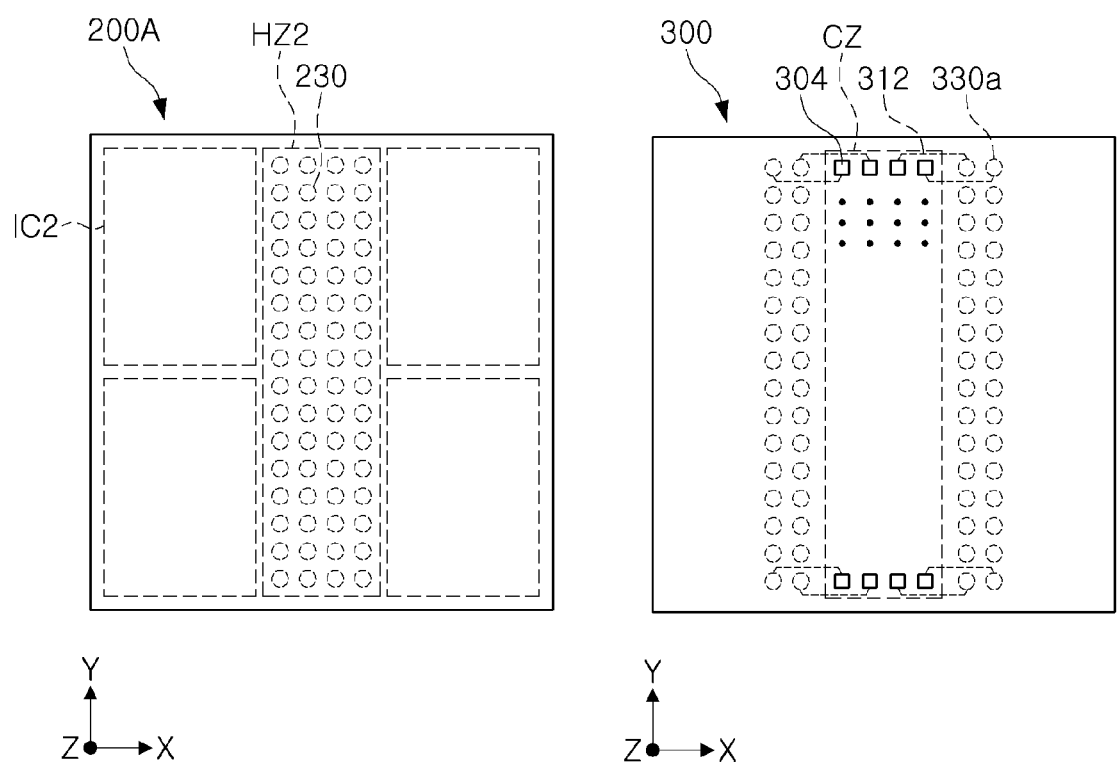

FIG. 1A is a cross-sectional diagram illustrating a semiconductor package 1000A according to an example embodiment. FIG. 1B is an enlarged diagram illustrating region "A" in FIG. 1A. FIGS. 2A to 2C are plan diagrams illustrating a first semiconductor chip 100, a dummy chip 300, and a second semiconductor chip 200 in FIG. 1A, according to an example embodiment.

Referring to FIGS. 1A and 1B, a semiconductor package 1000A according to an example embodiment may include a first semiconductor chip 100, a second semiconductor chip 200A, and a dummy chip 300 disposed between the first semiconductor chip 100 and the second semiconductor chip 200A. In the example embodiment, a plurality of second semiconductor chips 200A, 200B, 200C, and 200D stacked in a vertical direction (Z-axis direction) may be disposed on the dummy chip 300. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim). In example embodiments, the number of second semiconductor chips may be greater or less than the illustrated example in the drawings. For example, the semiconductor packages in the example embodiment may include three or less or five or more second semiconductor chips. Each semiconductor chip described herein may be a semiconductor die formed from a semiconductor wafer, and including electrical elements, such as through vias, wiring lines, and in some cases active and passive devices such as transistors or capacitors, formed therein or thereon. In some embodiments, dummy chip 300 is not formed of a semiconductor and does not include any active or passive devices.

The first semiconductor chip 100 and the second semiconductor chips 200A, 200B, 200C, and 200D stacked in the vertical direction (Z-axis direction) may be electrically connected to each other via first and second through electrodes 130 and 230 (e.g., conductive through electrodes passing vertically through the first semiconductor chip 100 and the second semiconductor chips 200A, 200B, 200C, and 200D). In such a multilayer structure, a hot zone in which a temperature may more rapidly increase than in the surrounding regions may be formed in the region in which the first and second through-electrodes 130 and 230 are densely disposed due to high-speed communication between the semiconductor chips and an increase in thermal resistance, and the hot zone may cause deterioration in performance of the semiconductor chips and deterioration in reliability of the semiconductor packages. The "hot zone" may not be a region in which the highest power is used, but may be a region in which the amount of power used relative to a unit area (e.g., density of power) is relatively high. The hot zone may also be referred to as a heat-producing zone.

In an example embodiment, by interposing a dummy chip 300 for dispersing a heat flow between the first semiconductor chip 100 and the lowermost second semiconductor chip 200A, the temperature rise of the second semiconductor chips 200A, 200B, 200C, and 200D may be prevented and the heat of the hot zone of the second semiconductor chips 200A, 200B, 200C, and 200D may be dispersed to the surrounding region without changing the positions of the first and second through electrodes 130 and 230 (without changing the design of the semiconductor chips). Accordingly, thermal dissipation properties of the semiconductor package may improve and reliability may improve. Hereinafter, the effect of reducing the temperature of the lowermost second semiconductor chip 200A by the dummy chip 300 will be mainly described, and the example embodiment may also be applied to the other second semiconductor chips 200B, 200C, and 200D. It should be noted that a dummy chip 300, including numerous elements, some described as "dummy" elements herein, may serve a function of transferring signals and voltages while redistributing heat within the package. Therefore, in some embodiments, the dummy chip 300 is only a "dummy" chip with respect to its lack of active or passive devices, and it may be alternatively referred to as a heat distribution chip or heat redistribution chip, and the various components, such as "dummy bumps," "dummy electrodes," or "dummy substrate," etc., may be referred to herein as heat distribution components or heat redistribution components (e.g., heat distribution/redistribution bumps, heat distribution/redistribution electrodes, or heat distribution/redistribution substrate). The dummy chip as described herein may also be described as an interposer chip.

Specifically, as illustrated in FIGS. 2A to 2C, the first semiconductor chip 100 may have a first hot zone HZ1 in which the first through electrodes 130 are densely disposed in the center thereof, the second semiconductor chip 200A may have a second hot zone HZ2 in which the second through electrodes 230 are densely disposed in the center thereof, and the dummy chip 300 may have a cool zone CZ in which the first dummy electrodes 330a are not disposed in the center thereof. The cool zone CZ may be described as a heat-prevention zone. The first hot zone HZ1, the second hot zone HZ2, and the cool zone CZ may overlap in the stacking direction (Z-axis direction), and the cool zone CZ may block a thermal flow flowing directly to the second hot zone HZ2 from the first hot zone HZ1, thereby reducing the temperature of the second hot zone HZ2. For example, the first dummy through electrodes 330a (also described as the first dummy chip electrodes or intermediate through electrodes) may not overlap the first and second hot zones HZ1 and HZ2 in the stacking direction (Z-axis direction), and the first through electrodes 130 (or the first semiconductor chip 100) may bypass the cool zone CZ through the first dummy electrodes 330a and may be electrically connected to the second through electrodes 230 (or the second semiconductor chip 200A). As described herein in the context of hot zones and cool zones, the terms "hot" and "cool" may refer to a relative heat of particular regions. For example, a cool zone, relative to a hot zone, will have a lower heat. Certain components or materials may be described herein as heat-conductive or thermally-conductive. The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials. Terms such as thermally insulating or a thermal barrier layer are intended to refer to materials that are typically known as good heat preventers or known to have utility for blocking or preventing transfer of heat. The semiconductor chip 100 and the dummy chip 300 may include a wiring layer 122 and a redistribution layer 312, respectively, for redistributing the first through electrodes 130 and the first dummy electrodes 330a, respectively.

Also, in an example embodiment, by forming a thermal barrier layer for blocking a heat flow between the first hot zone HZ1 and the cool zone CZ, the heat flow from the first hot zone HZ1 to the second hot zone HZ2 or the cool zone CZ may be more effectively blocked such that the temperature of the second hot zone HZ2 may be reduced. In an example embodiment, the first adhesive film 400A filling the space between the first semiconductor chip 100 and the dummy chip 300 may include a first thermal barrier layer TB1 disposed between the first hot zone HZ1 and the cool zone CZ. The first thermal barrier layer TB1 may be a region having thermal conductivity of about 0.5 W/mK or less, and may more effectively block a heat flow directly transferred from the first hot zone HZ1 to the second hot zone HZ2. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range. The first hot zone HZ1 and the second hot zone HZ2 illustrated in FIGS. 2A and 2B are merely examples of the regions in which a hotspot may be formed, which, however, does not indicate that the region having the highest temperature or the hotspot are formed throughout the first hot zone HZ1 and the second hot zone HZ2. For example, a decrease in the temperature of the first and second hot zones HZ1 and HZ2 or the dispersion of heat in the first and second hot zones HZ1 and HZ2 may indicate that the size or the area of the hotspot having the highest temperature in the first and second hot zones HZ1 and HZ2 may be reduced.

Hereinafter, components of the semiconductor package 1000A according to an example embodiment will be described in greater detail.

The first semiconductor chip 100 may include a first substrate 1, a first device layer 110, a first wiring structure 120, and a first through electrode 130. Various items described herein, such as a first wiring structure 120 and a first through electrode 130 are described in the singular, but may be provided in plural, as can be seen from the various figures. The first semiconductor chip 100 may be a buffer chip or a control chip including a plurality of logic devices and/or memory devices in the device layer 110. The first semiconductor chip 100 may transmit signals from the second semiconductor chips 200A, 200B, 200C, and 200D stacked thereon to an external entity, and may also transmit signals and power from an external entity to the second semiconductor chips 200A, 200B, 200C, and 200D. As illustrated in FIG. 2A, the first semiconductor chip 100 may include first integrated circuits IC1 disposed around the first hot zone HZ1. The first integrated circuits IC1 may include circuits for transmitting an address command and a control command such that the second semiconductor chips 200A, 200B, 200C, and 200D may store or output data, for example, input/output I/O circuits. For example, the first integrated circuits IC1 may perform a logic function and a memory function together through logic devices and memory devices. However, in example embodiments, the first integrated circuits IC1 may only include the logic devices and may perform a logic function.

The first substrate 101 may include or may be formed of, for example, a semiconductor element such as silicon or germanium (Ge), silicon carbide (SiC), gallium arsenide (GaAs), indium arsenide (InAs), or may include a compound semiconductor such as indium phosphide (InP). The first substrate 101 may have a silicon on insulator (SOI) structure. The first substrate 101 may include an active region, such as, for example, a well doped with impurities or a structure doped with impurities. The first substrate 101 may include various device isolation structures such as a shallow trench isolation (STI) structure. The first substrate 101 may have an active surface having an active region and an inactive surface disposed opposite to the active surface.

The first device layer 110 may be disposed on a lower surface (e.g., the active surface) of the first substrate 101, and may include various types of individual devices. The individual devices may be disposed on the active region of the first substrate 101, and may include various active devices and/or passive devices. The first device layer 110 may include a wiring layer for connecting a dielectric layer covering the individual devices to the individual devices, connecting the individual devices to the active region of the first substrate 101, or connecting the individual devices to the first lower bumps 106. A wiring layer for connecting may be included. The individual devices and the wiring layer of the first device layer 110 are not illustrated in the drawing, but the configuration may be understood from the second device layer 210 illustrated in FIG. 1B. First lower bumps 106 may be disposed below the first device layer 110. The first lower bumps 106 may include bumps for communicating with an external device (e.g., the element 800 in FIG. 8) in addition to bumps for communicating with the second semiconductor chips 200A, 200B, 200C, and 200D. Hereinafter, "bump" or "bumps" may be understood as "connection pad" or a "structure or terminal disposed on a connection pad" of a bare chip provided for vertical electrical connection. For example, the first lower bumps 106 may include a connection pad of the first semiconductor chip 100 and may be connected to a metal pillar disposed on a connection pad. Bumps as discussed herein may be formed of a conductive material, such as a metal. Bumps, as described herein, refer to an electrically and thermally conductive component raised above a surface of a layer such as a device layer, semiconductor layer, or insulating layer. Spatially relative terms, such as "beneath," "below," "lower," "above," "upper," "top," "bottom," and the like, may be used herein for ease of description to describe positional relationships, such as illustrated in the figures, for example. It will be understood that the spatially relative terms encompass different orientations of the device in addition to the orientation depicted in the figures. In addition, in some embodiments, "upper" and "lower" may be used as naming conventions to differentiate features from other features or different claim terms from other claim terms.

The first wiring structure 120 may be disposed on an upper surface (e.g., an inactive surface) of the first substrate 101 and may include an interlayer insulating layer 121 and a first wiring layer 122. The interlayer insulating layer 121 may include or may be formed of silicon oxide or silicon nitride. The first wiring layer 122 may have a multilayer structure including wiring patterns and vias. An insulating protective layer (not illustrated) for electrically isolating the first wiring layer 122 from the first substrate 101 may be disposed between the first wiring structure 120 and the first substrate 101. In an example embodiment, the first wiring structure 120 may redistribute the first through electrodes 130 (e.g., signals and voltage passing through the first through electrodes 130) to the external side of the first hot zone HZ1. For example, referring to FIG. 2A together with FIG. 1B, the first wiring structure 120 may include first upper bumps 104 disposed to be shifted (e.g., horizontally) from the first hot zone HZ1 (or the first through electrodes 130), and a first wiring layer 122 disposed between the first substrate 101 and the first upper bumps 104 and electrically connecting the first through electrodes 130 to the first upper bumps 104. The first upper bumps 104 may be disposed to not overlap the first hot zone HZ1 and the cool zone CZ in the stacking direction (Z-axis direction) of the first semiconductor chip 100 and the dummy chip 300, and may be spaced apart from the thermal barrier layer TB1 in the horizontal direction (Y-axis and X-axis direction). For example, the first upper bumps 104 may be disposed to surround the first thermal barrier layer TB1 in the X-Y direction. The first upper bumps 104 may include heat dissipation (e.g., heat-conductive) upper bumps 104T electrically insulated from the first through electrodes 130 in addition to the bumps for communication with the second semiconductor chips 200A, 200B, 200C, and 200D. The first upper bumps 104 may be electrically connected to the lower dummy bumps 306 of the dummy chip 300 through the solder balls SB, but the connection structure between the first upper bumps 104 and the lower dummy bumps 306 may not be limited to the above-described example. In example embodiments, the first upper bumps 104 and the lower dummy bumps 306 may be directly bonded to each other without an electrical connection member (e.g., a solder ball). In this case, the first adhesive film 400A may not be provided, and insulating material layers surrounding the first upper bumps 104 and the lower dummy bumps 306 may be directly bonded to each other (the example embodiment in FIG. 7A).

The first through electrode 130 may penetrate the first substrate 101 in a vertical direction (Z-axis direction), and may provide an electrical path connecting the first upper bumps 104 to the first lower bumps 106. The first through electrode 130 may include a conductive plug 132 and a barrier layer 131 surrounding the conductive plug 132. The conductive plug 132 may include or be formed of a metal material, such as, for example, tungsten (W), titanium (Ti), aluminum (Al), or copper (Cu). The conductive plug 132 may be formed by a plating process, a PVD process, or a CVD process. The barrier layer 131 may electrically separate the conductive plug 132 from the first substrate 101. The barrier layer 131 may be formed of an insulative material by a PVD process or a CVD process.

The second semiconductor chips 200A, 200B, 200C, and 200D may be disposed on the dummy chip 300, and each of the second semiconductor chips 200A, 200B, 200C, and 200D may include the second substrate 201, the second device layer 210, and the second through electrodes 230. Since the second semiconductor chips 200A, 200B, 200C, and 200D may have substantially the same or similar structures, hereinafter, the lowermost second semiconductor chip 200A will be mainly described, and the descriptions of the same components will not be provided. Differently from the other second semiconductor chips 200A, 200B, and 200C, however, the uppermost second semiconductor chip 200D may not include the second through electrode 230 and may have a relatively large thickness. Also, the second substrate 201, the second device layer 210, and the second through electrode 230 may be configured the same as or similarly to the first substrate 101, the first device layer 110, and the first through electrode 130 of the first semiconductor chip 100, overlapping descriptions will not be provided. As illustrated in FIG. 2B, the second semiconductor chip 200A may include second integrated circuits IC2 disposed around the second hot zone HZ2. The second integrated circuits IC2 may include memory devices storing or outputting data based on an address command and a control command received from the first semiconductor chip 100. For example, the memory devices may include volatile memory devices such as DRAM and SRAM, or non-volatile memory devices such as PRAM, MRAM, FeRAM, or RRAM. In this case, the semiconductor package in one example embodiment may be used in a high bandwidth memory (HBM) product, an electronic data processing (EDP) product, or the like. HBM products may have a high density of microbumps and through electrodes, which may be at a pitch, for example, in the micrometer range. For example, through substrate vias, such as through silicon vias, in a HBM memory device may be separated by a pitch from about 20 µm to about 50 µm.

The second substrate 201 may include or be formed of a material similar to that of the first substrate 101, and second upper bumps 204 may be disposed on the second substrate 201. An insulating protective film 203 may be disposed between the second upper bumps 204 and the second substrate 201. In the drawing, the second through electrodes 230 may contact the second upper bumps 204, but in example embodiments, a wiring layer for connecting the second through electrodes 230 to the second upper bumps 204 may be formed between the second through electrodes 230 and the second upper bumps 204. The term "contact" as used herein refers to a direct connection, i.e., touching.

The second device layer 210 may include a second dielectric layer 211, a second wiring layer 212, and individual devices 213. The individual devices 213 and the second wiring layer 212 may be combined with each other and may form memory devices. Second lower bumps 206 may be disposed below the second device layer 210. The second lower bumps 206 may include heat dissipation lower bumps 206T electrically insulated from the second through electrodes 230 in addition to the bumps electrically connected to the second through electrodes 230. The second lower bumps 206 may be electrically connected to the upper dummy bumps 304 of the dummy chip 300 through the solder balls SB, but an example embodiment thereof is not limited thereto.

The second through electrodes 230 may be disposed in the second hot zone HZ2 overlapping the first hot zone HZ1 and the cool zone CZ in the stacking direction (Z-axis direction). The second through electrodes 230 may be electrically connected to the first dummy electrodes 330a of the dummy chip 300, respectively, such that an electrical path connecting the first semiconductor chip 100 to the second semiconductor chips 200A, 200B, 200C, and 200D may be formed. Each of the second through electrodes 230 may include a conductive plug 232 and a barrier layer 231 surrounding the conductive plug 232.

The dummy chip 300 may include a dummy substrate 301, a redistribution structure 310, and first dummy through electrodes 330a. Since a portion of components of the dummy chip 300 may be configured the same as or similarly to the first semiconductor chip 100 and the second semiconductor chips 200A, 200B, 200C, and 200D, overlapping descriptions will not be provided. In the example embodiment, by forming the cool zone CZ in the center of the dummy chip 300 and disposing the cool zone CZ between the first hot zone HZ1 and the second hot zone HZ2, the temperature rise of the second hot zone HZ2 may be prevented. The dummy chip 300 may include a cool zone CZ in which the first dummy through electrodes 330a are not disposed. The cool zone CZ may be a region in which the first dummy through electrodes 330a transmitting power or signals between the first semiconductor chip 100 and the second semiconductor chips 200A, 200B, 200C, and 200D are not disposed, and may be understood as a region in which the temperature rise may be low even while power is supplied. The first dummy through electrodes 330a may be disposed around the cool zone CZ, and may electrically connect the first and second through electrodes 130 and 230 disposed in the first and second hot zones HZ1 and HZ2 to each other. The dummy chip 300 may include lower dummy bumps 306 disposed below the first dummy through electrodes 330a. The lower dummy bumps 306 may include heat dissipation lower dummy bumps 306T electrically insulated from the first dummy through electrodes 330a in addition to the bumps electrically connected to the first dummy through electrodes 330a. The lower dummy bumps 306 may be electrically connected to the first upper bumps 104 through the solder ball SB. An insulating protective film 303 may be disposed between the lower dummy bumps 306 and the dummy substrate 301. The hot zones HZ1 and HZ2 and the cool zone CZ may include bounded areas formed within a particular region of each semiconductor chip. For example, each of these zones may be a rectangular area that spans the length and width of a plurality of through electrodes in the horizontal X and Y directions. As described herein, a "region occupied" by an array of through electrodes (e.g., arranged in an X and Y direction) includes an entire region within boundaries set by the outer-most through electrodes of the array. The hot zones and cool zone described herein may coincide with a region occupied by an array of through electrodes, when viewed from a plan view (e.g., from the Z-axis direction).

The redistribution structure 310 may be disposed on the upper surface of the dummy substrate 301 and may include an interlayer insulating layer 311 and a redistribution layer 312. The interlayer insulating layer 311 may include or be formed of silicon oxide or silicon nitride. The redistribution layer 312 may have a multilayer structure including a wiring pattern and a via, both formed of conductive materials. An insulating protective film (not illustrated) electrically isolating the redistribution layer 312 from the dummy substrate 301 may be disposed between the redistribution structure 310 and the dummy substrate 301. In one example embodiment, the redistribution structure 310 may redistribute signals and voltages from the first dummy electrodes 330a to an area that overlaps the cool zone CZ in the Z-axis direction. For example, referring to FIG. 2C, the redistribution structure 310 may include upper dummy bumps 304 disposed to overlap the cool zone CZ, and a redistribution layer 312 disposed between the dummy substrate 301 and the upper dummy bumps 304 and electrically connecting the first dummy electrodes 330a to the upper dummy bumps 304. The upper dummy bumps 304 may be disposed to overlap the first and second hot zones HZ1 and HZ2 in the stacking direction (Z-axis direction), and may be electrically connected to the second through electrodes HZ2 in the second hot zone HZ2. Also, the upper dummy bumps 304 may include heat dissipation upper dummy bumps 304T electrically insulated from the first dummy electrodes 330a. The upper dummy bumps 304 may be electrically connected to the second lower bumps 206 of the second semiconductor chip 200A through the solder ball SB, but the connection structure between the second lower bumps 206 and the upper dummy bumps 304 is not limited thereto.

The semiconductor package 1000A according to an example embodiment may further include first to fifth adhesive films 400A, 400B, 400C, 400D, and 400E disposed between the first semiconductor chip 100, the second semiconductor chips 200A, 200B, 200C, and 200D, and the dummy chip 300, and an encapsulant 500 surrounding the second semiconductor chips 200A, 200B, 200C, and 200D and the dummy chip 300 on the first semiconductor chip 100.

Since the first to fifth adhesive films 400A, 400B, 400C, 400D, and 400E may have substantially the same structure or similar structures, the first adhesive film 400A will be mainly described, and overlapping descriptions will not be provided. The first adhesive film 400A may fill a space between the first semiconductor chip 100 and the dummy chip 300 and may cover at least a portion of each of the first upper bumps 104 and the lower dummy bumps 306. The first adhesive film 400A may be a non-conductive film (NCF), but an example embodiment thereof is not limited thereto, and the first adhesive film 400A may include, for example, various types of polymer films applicable for a thermocompression bonding process. In example embodiments, by forming the first thermal barrier layer TB1 in the first adhesive film 400A, heat generated in the first hot zone HZ1 or transmitted through the first hot zone HZ1 may be dispersed in the horizontal direction (the X-axis or Y-axis direction). The first thermal barrier layer TB1 may be a region impregnated with a filler having low thermal conductivity, such as, for example, silica, in the non-conductive film, and may be disposed between the cool zone CZ of the dummy chip 300 and the first hot zones HZ1 of the first semiconductor chip 100. The first thermal barrier layer TB1 may have thermal conductivity of about 0.5 W/mK or less, such as, for example, in the range of about 0.5 W/mK to about 0.0001 W/mK, in the range of about 0.3 W/mK to about 0.0001 W/mK, or in the range of about 0.1 W/mK to about 0.1 W/mK. Since the heat transferred from the first hot zone HZ1 may flow to the external side of the first thermal barrier layer TB1 having low thermal conductivity, the temperature rise of the cool zone CZ disposed above the first hot zone HZ1 and the second hot zone HZ2 may be prevented. In example embodiments, the second to fifth adhesive films 400B, 400C, 400D, and 400E may also include a thermal barrier layer, and in this case, a second wiring layer (see the example embodiment in FIG. 4) for redistributing the second lower bumps 206 to the external side of the second hot zone HZ2 may be formed.

The encapsulant 500 may be disposed on the first semiconductor chip 100, and may encapsulate the dummy chip 300 and at least a portion of each of the second semiconductor chips 200A, 200B, 200C, and 200D. As illustrated in FIG. 1A, the encapsulant 500 may be formed to expose the upper surface of the uppermost second semiconductor chip 200D. However, in example embodiments, the encapsulant 500 may be formed to cover the upper surface of the uppermost second semiconductor chip 200D. The encapsulant 500 may include, for example, an epoxy mold compound (EMC), but the material of the encapsulant 500 is not limited to any particular example.

Figure 3A:
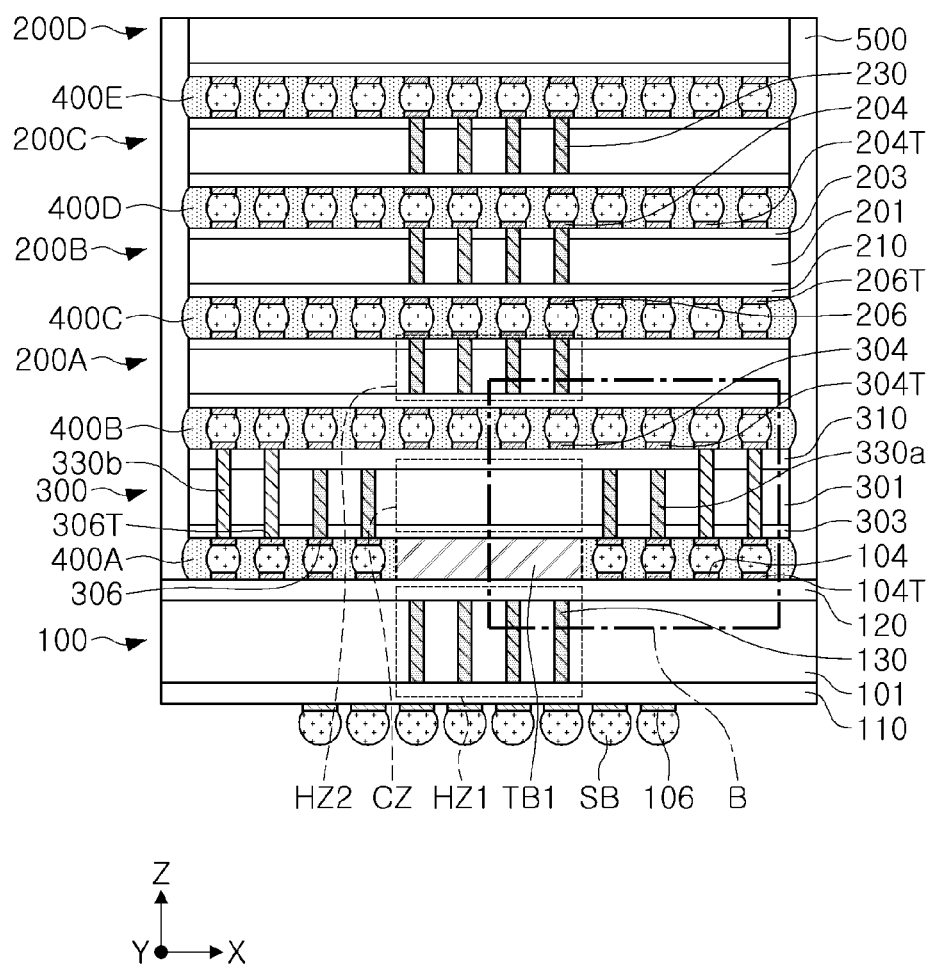
FIG. 3A is a cross-sectional diagram illustrating a semiconductor package according to an example embodiment of the present disclosure.
Figure 3B:
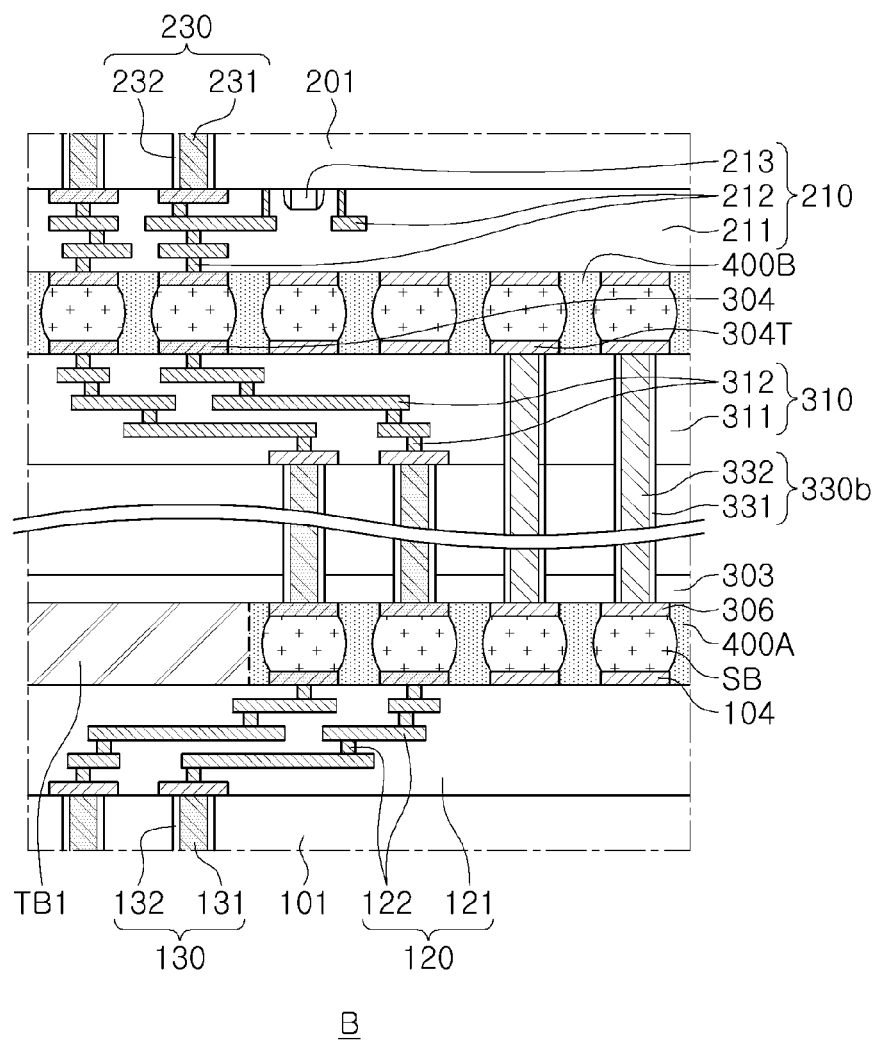
FIG. 3B is an enlarged diagram illustrating region "B" in FIG. 3A.

FIG. 3A is a cross-sectional diagram illustrating a semiconductor package 1000B according to an example embodiment. FIG. 3B is an enlarged diagram illustrating region "B" in FIG. 3A.

Referring to FIGS. 3A and 3B, the semiconductor package 1000B according to an example embodiment may be configured similarly to the aforementioned example embodiment described with reference to FIGS. 1A to 2C other than the configuration in which the dummy chip 300 may further include second dummy through electrodes 330b disposed on the external side the cool zone CZ. The second dummy through electrodes 330b may be disposed outside of an area occupied by the first dummy through electrodes 330a and may be electrically insulated from the first dummy through electrodes 330a. For example, the second dummy through electrodes 330b may be disposed more adjacent to the edge of the dummy chip 300 than the first dummy through electrodes 330a. Also, the second dummy through electrodes 330b may penetrate the dummy substrate 301 and may connect the heat dissipation upper dummy bumps 304T to the heat dissipation lower dummy bumps 306T. Accordingly, the second dummy through electrodes 330b may form a thermal path extending in the vertical direction (Z-axis direction) around the cool zone CZ such that heat dissipated in the horizontal direction (X-axis or Y-axis direction) by the first thermal barrier layer TB1 may not flow into the cool zone CZ.

Figure 4A:
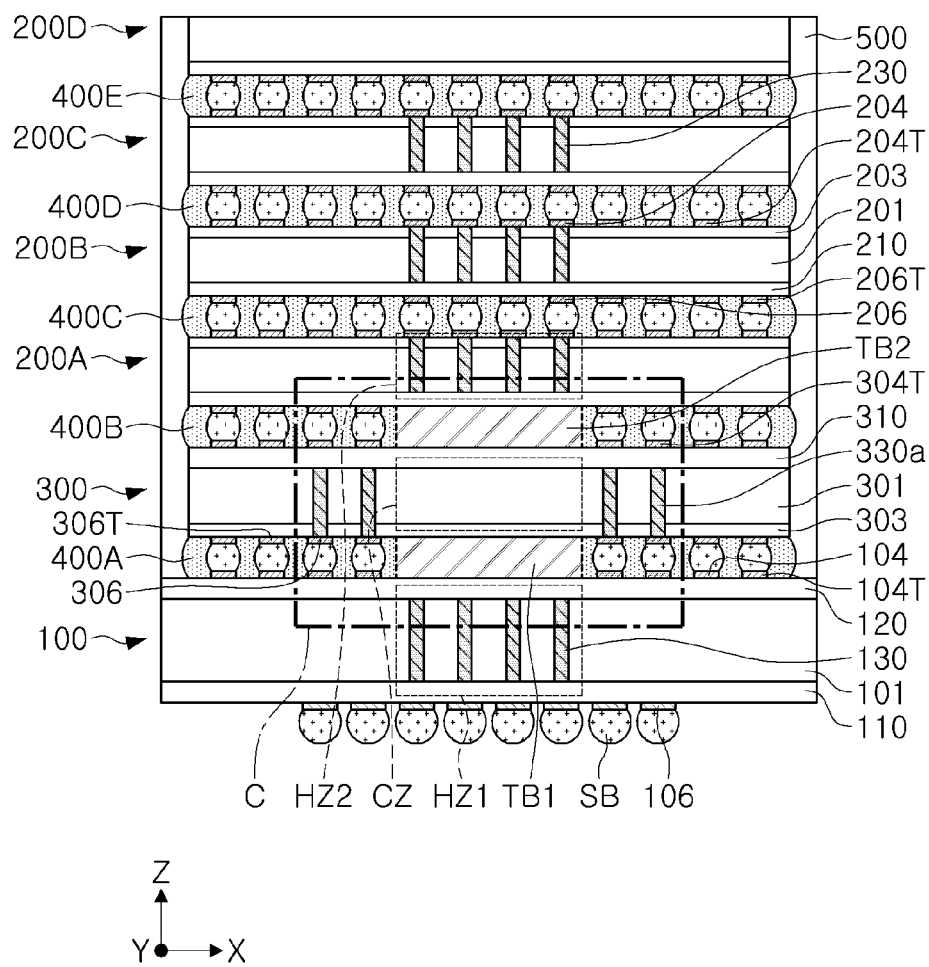
FIG. 4A is a cross-sectional diagram illustrating a semiconductor package according to an example embodiment of the present disclosure.
Figure 4B:
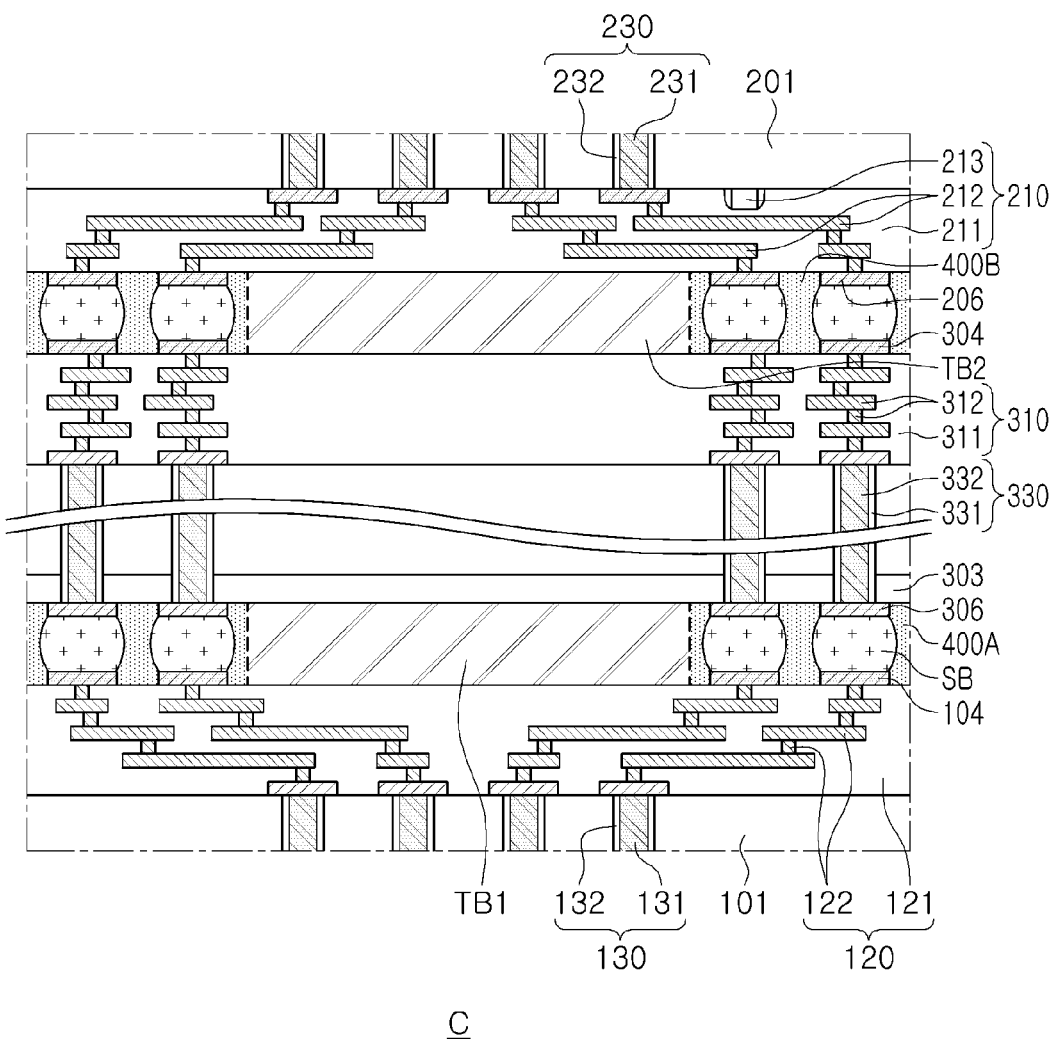
FIG. 4B is an enlarged diagram illustrating region "C" in FIG. 4A.

FIG. 4A is a cross-sectional diagram illustrating a semiconductor package 1000C according to an example embodiment. FIG. 4B is an enlarged diagram illustrating region "C" in FIG. 4A.

Referring to FIGS. 4A and 4B, the semiconductor package 1000C according to an example embodiment may be configured similarly to the aforementioned example embodiment described with reference to FIGS. 1A to 3B other than the configuration in which the semiconductor package 1000C may further include a second thermal barrier layer TB2 disposed between the cool zone CZ and the second hot zone HZ2. For example, the second adhesive film 400B filling the space between the second semiconductor chip 200A and the dummy chip 300 may include a second thermal barrier layer TB2 disposed between the second hot zone HZ2 and the cool zone CZ. In this case, the second lower bumps 206 of the second semiconductor chip 200A may be redistributed to be spaced apart from the second thermal barrier layer TB2. For example, the second lower bumps 206 may be disposed to not overlap the second hot zone HZ2 and the cool zone CZ in the stacking direction (Z-axis direction), and the second lower bumps 206 may be electrically connected to the second through electrodes 230 by the second wiring layer 212. The second thermal barrier layer TB2 may be a region having low thermal conductivity similarly to the first thermal barrier layer TB1, and may more effectively block heat transferred from the first hot zone HZ1. In the example embodiment, the second thermal barrier layer TB2 may be provided by the second adhesive film 400B, but an example embodiment thereof is not limited thereto. In example embodiments, the second thermal barrier layer TB2 may be formed in the upper bonding layer 305 (in FIG. 7B) of the dummy chip 300 and/or the lower passivation layer 207 (FIG. 7B) of the lowermost second semiconductor chip 200A (the example embodiment in FIGS. 7a and 7b).

Figure 5A:
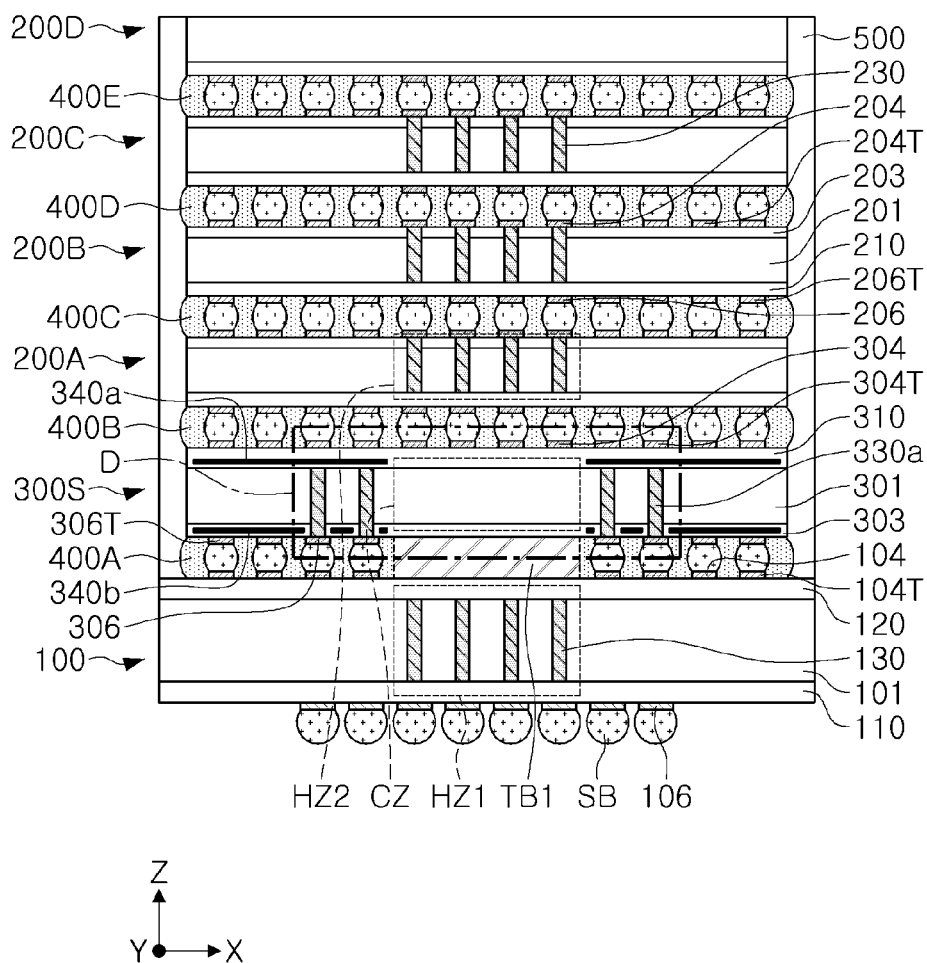
FIG. 5A is a cross-sectional diagram illustrating a semiconductor package according to an example embodiment of the present disclosure.
Figure 5B:
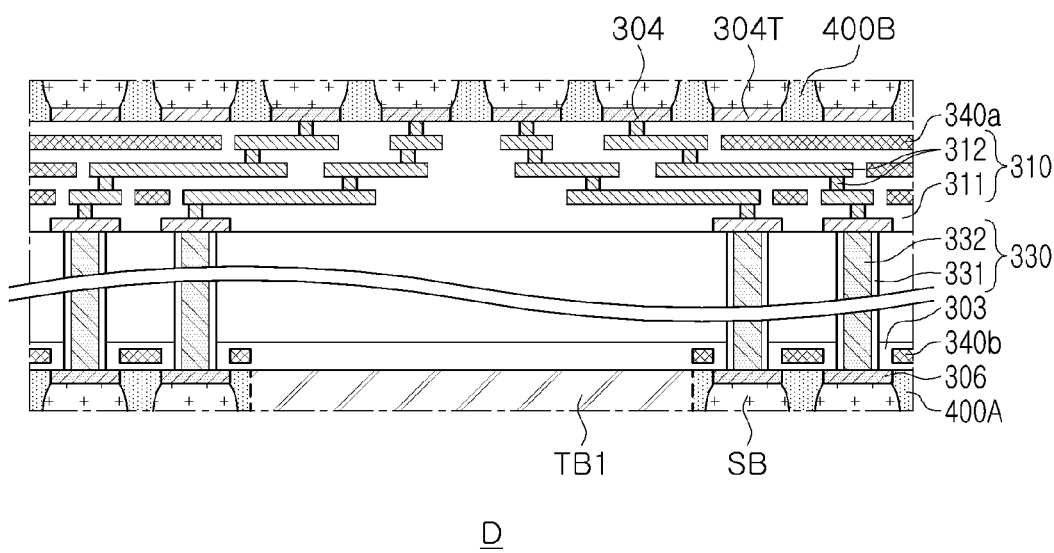
FIG. 5B is an enlarged diagram illustrating region "D" in FIG. 5A.
Figure 6A:
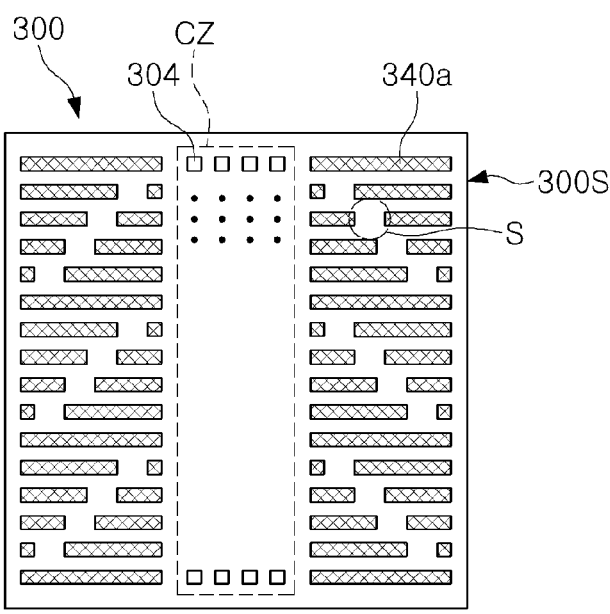
FIGS. 6A and 6B are plan diagrams illustrating an example of a heat dissipation layer applicable to the semiconductor package illustrated in FIG. 5A.
Figure 6A:
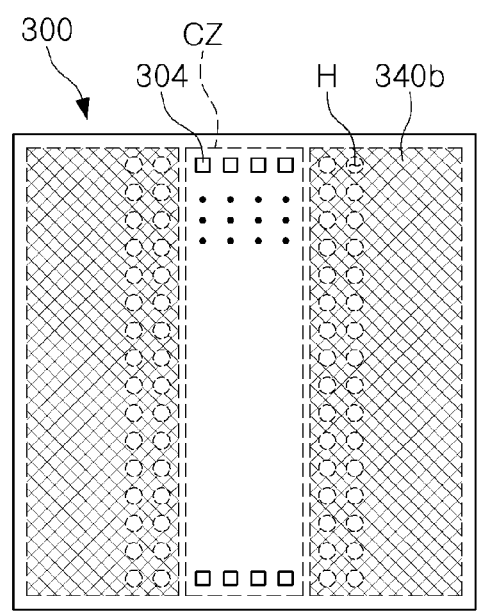
Figure 6A:
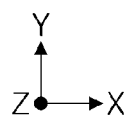
Figure 6B:
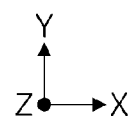

FIG. 5A is a cross-sectional diagram illustrating a semiconductor package 1000D according to an example embodiment. FIG. 5B is an enlarged diagram illustrating region "D" in FIG. 5A. FIGS. 6A and 6B are plan diagrams illustrating an example of a heat dissipation layer 340a and 340b applicable to the semiconductor package 1000D illustrated in FIG. 5A.

Referring to FIGS. 5A and 5B, the semiconductor package 1000D in the example embodiment may be configured similarly to the aforementioned example embodiment described with reference to FIGS. 1A to 4 other than the configuration in which the semiconductor package 1000D may further include heat dissipation layers 340a and 340b for dispersing heat dispersed in the horizontal direction (X-axis or Y-axis direction) to the periphery of the dummy chip 300 by the first thermal barrier layer TB1 or the cool zone CZ. For example, the heat dissipation layers 340a and 340b may extend from the periphery of the cool zone CZ to the edge 300S of the dummy chip 300 and may be electrically insulated from the first dummy electrodes 330a. For example, the heat dissipation layers 340a and 340b may be physically and electrically spaced apart from the redistribution layer 312 and/or the first dummy electrodes 330a in the redistribution structure 310 and/or the insulating protective film 303. The heat dissipation layers 340a and 340b may include or be formed of, for example, a metal such as copper (Cu), aluminum (Al), silver (Ag), tin (Sn), gold (Au), or nickel (Ni), or a material having high thermal conductivity such as graphite.

As illustrated in FIG. 6A, the heat dissipation layer 340a may have a linear shape extending in the horizontal direction (e.g., the X-axis direction) between the cool zone CZ and the edge 300S of the dummy chip 300. In this case, the heat dissipation layer 340a may have an isolation region S spaced apart from the redistribution layer 312 and/or the first dummy electrodes 330a. The heat dissipation layer 340a may be configured as a linear line extending toward the edge 300S of the dummy chip 300, but in example embodiments, the heat dissipation layer 340a may include a portion curved by 45 degrees and 60 degrees to not overlap wiring patterns and vias.

As illustrated in FIG. 6B, the heat dissipation layer 340b may have a plate shape covering most of the region other than the cool zone CZ. In this case, the heat dissipation layer 340b may have a through hole H spaced apart from the redistribution layer 312 and/or the first dummy electrodes 330a. The through hole H may have a circular shape passing through the first dummy electrodes 330a or vias, but an example embodiment thereof is not limited thereto. The shape of the through hole H may be varied to not overlap the wiring pattern.

Figure 7A:
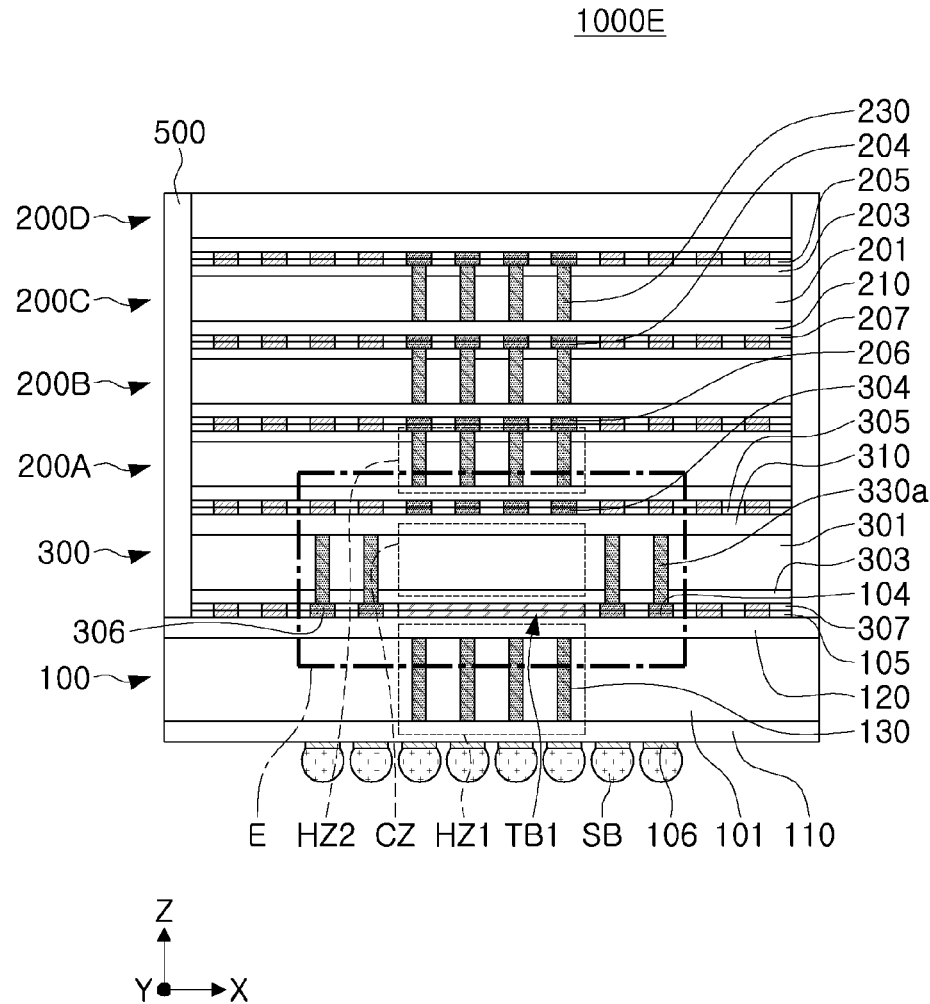
FIG. 7A is a cross-sectional diagram illustrating a semiconductor package according to an example embodiment of the present disclosure.

FIG. 7A is a cross-sectional diagram illustrating a semiconductor package 1000E according to an example embodiment. FIG. 7A is an enlarged diagram illustrating region "E" in FIG. 7A.

Figure 7B:
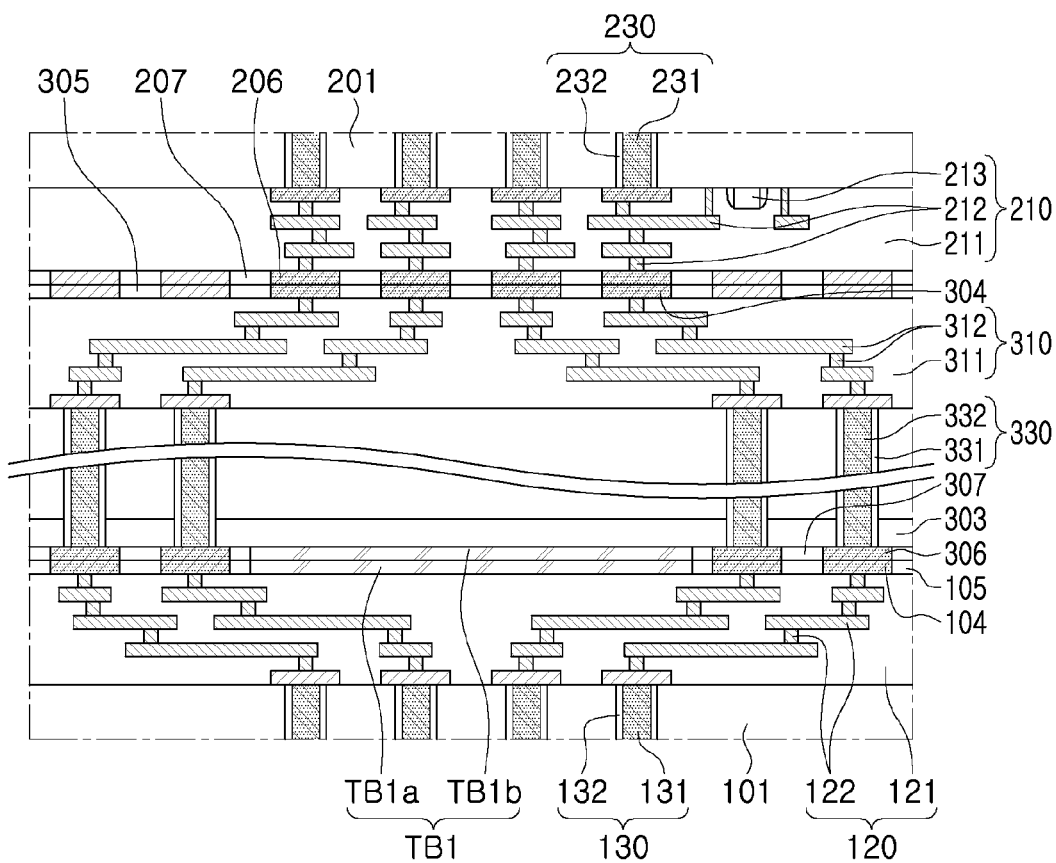
FIG. 7B is an enlarged diagram illustrating region "E" in FIG. 7A.

Referring to FIGS. 7A and 7B, the semiconductor package 1000E according to an example embodiment may be configured the same as or similarly to the aforementioned example embodiment described with reference to FIGS. 1A to 6B other than the configuration in which the first semiconductor chip 100, the dummy chip 300, and the second semiconductor chips 200A, 200B, 200C, and 200D may be directly bonded and coupled to each other (e.g., by hybrid bonding or direct bonding) without a connection member (e.g., a metal pillar, a solder bump, an adhesive film, or the like). In this example embodiment, the first semiconductor chip 100 may further include a first upper passivation layer 105 surrounding the first upper bumps 104, and the dummy chip 300 may further include a lower bonding layer 307 surrounding the lower dummy bumps 306 and an upper bonding layer 305 surrounding the upper dummy bumps 304. The first upper bumps 104 may be bonded and coupled to the lower dummy bumps 306, and the first upper passivation layer 105 may be bonded and coupled to the lower bonding layer 307. The first upper passivation layer 105 and the lower bonding layer 307 may include a material to be bonded to each other, such as, for example, silicon oxide. The first upper bumps 104 and the lower dummy bumps 306 include or are formed of a material to be bonded to each other, such as, for example, one of copper (Cu), nickel (Ni), gold (Au), and silver (Ag) or an alloy thereof. Similarly, the second semiconductor chips 200A, 200B, 200C, and 200D may further include a second lower passivation layer 207 and/or a second upper passivation layer 205. For example, the first semiconductor chip 100 and the dummy chip 300 may be bonded to each other by bonding the upper surface of the first semiconductor chip 100 provided by the first upper bumps 104 and the first upper passivation layer 105 to the lower surface of the dummy chip 300 provided by the lower dummy bumps 306 and the lower bonding layer 307 and applying pressure at thermal atmosphere of about 200° C. to about 300° C. The temperature of the thermal atmosphere is not limited to about 200° C. to about 300° C. and may be varied.

Also, in the example embodiment, a first thermal barrier layer TB1 overlapping the first hot zone HZ1 and the cool zone CZ in the vertical direction (Z-axis direction) may be formed in the upper passivation layer 105 and the lower bonding layer 307. For example, the first thermal barrier layer TB1 may include a lower thermal barrier layer TB1a formed in the upper passivation layer 105 and an upper thermal barrier layer TB1b formed in the lower bonding layer 307. The lower thermal barrier layer TB1a and the upper thermal barrier layer TB1b may include or be formed of an insulating material having thermal conductivity of about 0.5 W/mK or less, such as, for example, photosensitive polyimide (PSPI). The lower thermal barrier layer TB1a and the upper thermal barrier layer TB1b may be formed by filling the cavity formed in the upper passivation layer 105 and the lower bonding layer 307 with the insulating material (see FIGS. 11A to 11D). In example embodiments, at least one of the lower thermal barrier layer TB1a and the upper thermal barrier layer TB1b may not be provided.

Figure 8:
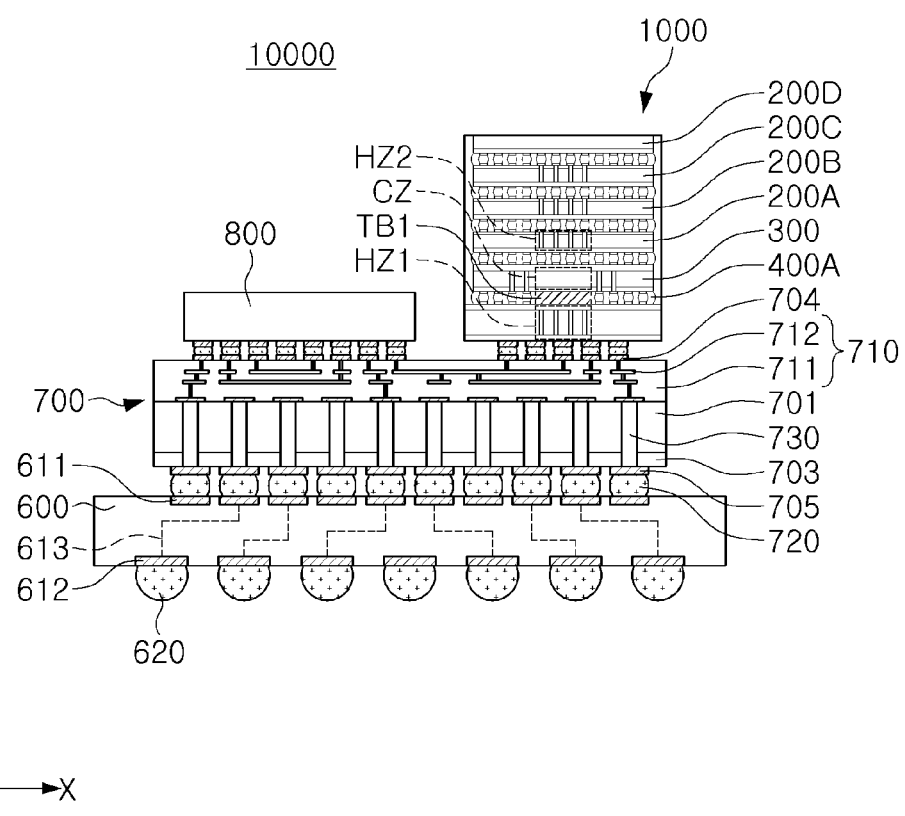
FIG. 8 is a cross-sectional diagram illustrating a semiconductor package according to an example embodiment of the present disclosure.

FIG. 8 is a cross-sectional diagram illustrating a semiconductor package 10000 according to an example embodiment.

Referring to FIG. 8, a semiconductor package 10000 according to an example embodiment may include a package substrate 600, an interposer substrate 700, and at least one chip structure 1000. Also, the semiconductor package 10000 may further include a logic chip or a processor chip 800 disposed adjacent to the chip structure 1000 on the interposer substrate 700.

The package substrate 600 may include a lower pad 612 disposed on the lower surface of the body, an upper pad 611 disposed on the upper surface of the body, and a redistribution circuit 613 electrically connecting the lower pad 612 to the upper pad 611. The package substrate 600 may be a support substrate on which the interposer substrate 700, the logic chip 800, and the chip structure 1000 are mounted, and may be configured as a substrate for a semiconductor package including a printed circuit board (PCB), a ceramic substrate, a glass substrate, a tape wiring board, and the like. The body of the package substrate 600 may include different materials depending on a type of the substrate. For example, when the package substrate 600 is a printed circuit board, the package substrate 600 may be configured such that a wiring layer is further stacked on a body copper clad laminate or an end surface of both surfaces of the copper clad laminate. A solder resist layer may be formed on each of the lower surface and upper surface of the package substrate 600. The lower and upper pads 612 and 611 and the redistribution circuit 613 may form an electrical path connecting the lower surface and the upper surface of the package substrate 600 to each other. The lower and upper pads 612 and 611 and the redistribution circuit 613 may be formed of a metal material, such as, for example, at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C) or an alloy including two or more metals. The redistribution circuit 613 may include multiple redistribution layers and vias connecting the redistribution layers to each other. An external connection terminal 620 connected to the lower pad 612 may be disposed on the lower surface of the package substrate 600. The external connection terminal 620 may include or be formed of tin (Sn), indium (In), bismuth (Bi), antimony (Sb), copper (Cu), silver (Ag), zinc (Zn), lead (Pb) and/or an alloy thereof.

The interposer substrate 700 may include a substrate 701, a lower protective layer 703, a lower pad 705, an interconnection structure 710, a metal bump 720, and a through via 730. The chip structure 1000 and the processor chip 800 may be stacked on the package substrate 600 via the interposer substrate 700. The interposer substrate 700 may electrically connect the chip structure 1000 to the processor chip 800.

The substrate 701 may be formed of one of silicon, an organic material, plastic, and a glass substrate, for example. When the substrate 701 is configured as a silicon substrate, the interposer substrate 700 may be referred to as a silicon interposer. Also, when the substrate 701 is configured as an organic substrate, the interposer substrate 700 may be referred to as a panel interposer.

A lower passivation layer 703 may be disposed on the lower surface of the substrate 701, and a lower pad 705 may be disposed on the lower passivation layer 703. The lower pad 705 may be connected to the through via 730. The chip structure 1000 and the processor chip 800 may be electrically connected to the package substrate 600 through the metal bumps 720 disposed on the lower pad 705.

The interconnection structure 710 may be disposed on the upper surface of the substrate 701, and may include an interlayer insulating layer 711 and a single-layer wiring structure 712 or a multiple-layer wiring structure 712. When the interconnection structure 710 has a multiple-layer wiring structure, wiring patterns of different layers may be connected to each other through contact vias.

The through via 730 may extend from the upper surface to the lower surface of the substrate 701 and may penetrate the substrate 701. Also, the through via 730 may extend into the interconnection structure 710 and may be electrically connected to wirings of the interconnection structure 710. When the substrate 701 is silicon, the through via 730 may be referred to as a TSV. The other structure and material of the through via 730 may be the same as in the semiconductor package 1000A in the aforementioned example embodiment in FIG. 1A. In example embodiments, the interposer substrate 700 may include only the interconnection structure therein, and may not include a through via.

The interposer substrate 700 may be used to convert or transfer an input electrical signal between the package substrate 600 and the chip structure 1000 or the processor chip 800. Accordingly, the interposer substrate 700 may not include devices such as active devices or passive devices. Also, in example embodiments, the interconnection structure 710 may be disposed below the through via 730. For example, the positional relationship between the interconnection structure 710 and the through via 730 may be relative to each other.

The metal bump 720 may be disposed on the lower surface of the interposer substrate 700 and may be electrically connected to the wiring of the interconnection structure 710. The interposer substrate 700 may be stacked on the package substrate 600 through the metal bump 720. The metal bump 720 may be connected to the lower pad 705 through wirings of the interconnection structure 710 and the through via 730. In an example, a portion of the lower pads 705 used for power or ground may be integrated and connected together to the metal bump 720, such that the number of the lower pads 705 may be greater than the number of of the metal bump 720.

A logic chip or the processor chip 800 may include, for example, a central processor (CPU), a graphics processor (GPU), a field programmable gate array (FPGA), a digital signal processor (DSP), a cryptographic processor, a microprocessor, a microcontroller, an analog-to-digital converter, an application-specific ICs (ASICs), and the like. The semiconductor package 10000 may be referred to as a server-oriented semiconductor package or a mobile-oriented semiconductor package depending on the types of devices included in the logic chip 800.

The chip structure 1000 may be configured similarly to the semiconductor packages 1000A, 1000B, 1000C, 1000D, and 1000E described with reference to FIGS. 1A to 6B. For example, the chip structure 1000 may include a dummy chip 300 disposed between the first hot zone HZ1 of the first semiconductor chip 100 and the second hot zone HZ2 of the second semiconductor chip 200A, and a first adhesive film 400A, and the dummy chip 300 and the first adhesive film 400A may have a cool zone CZ and a first thermal barrier layer TB1 overlapping the first and second hot zones HZ1 and HZ20 in the stacking direction (Z-axis direction), respectively.

The semiconductor package 10000 may further include an internal encapsulant material covering the side and upper surfaces of the chip structure 1000 and the processor chip 800 on the interposer substrate 700. Also, the semiconductor package 10000 may further include an external encapsulant material covering the interposer substrate 700 and the internal encapsulant material on the package substrate 600. The external encapsulant material and the internal encapsulant material may be formed together and may not be distinct from each other. In example embodiments, the semiconductor package 10000 may further include a heat dissipation plate covering the chip structure 1000 and the processor chip 800 on the package substrate 600.

Figure 9C:
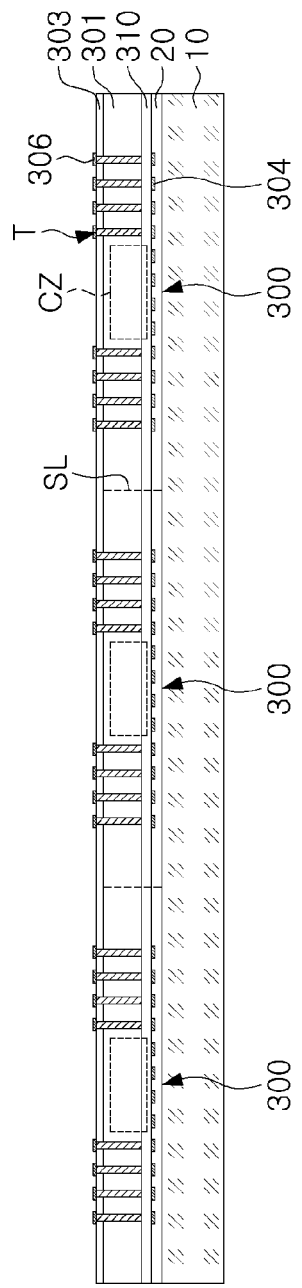

FIGS. 9A to 9C are cross-sectional diagrams illustrating a method of manufacturing a dummy chip according to an example embodiment.

Referring to FIG. 9A, a semiconductor wafer 300W for a plurality of dummy chips 300 may be temporarily bonded to be supported by a carrier substrate 10 using an adhesive material layer 20. The semiconductor wafer 300W may be bonded such that the surface on which the redistribution structure 310 is formed may be directed to the carrier substrate, and the semiconductor wafer 300W may be stably supported by the adhesive material layer 20 such as glue during a subsequent process. The semiconductor wafer 300W may be in a state in which partial components for the dummy chip 300 may be formed. For example, the semiconductor wafer 300W may include a redistribution structure 310 disposed on one surface of the dummy substrate 301, an upper dummy bump 304 disposed below the redistribution structure 310, and dummy electrodes 330 (the "upper" is with respect to the example illustrated in FIGS. 1A and 1B.) The dummy electrodes 330 may be formed to have a depth to not entirely penetrate the semiconductor wafer 300W before or while the redistribution structure 310 is formed. The "dummy electrodes 330" may collectively refer to the first dummy electrodes 330a and the second dummy electrodes 330b in FIGS. 3A and 3B.

Referring to FIG. 9B, the thickness of the semiconductor wafer 300W may be reduced by applying a polishing process to the upper surface 51 of the semiconductor wafer 300W. As a portion of the semiconductor wafer 300W is removed, the upper ends T of the dummy electrodes 330 may protrude from the upper surface 51 of the semiconductor wafer 300W. Through the polishing process, the thickness of the semiconductor wafer 300W may be reduced to a desired thickness of the dummy chip 300. As the polishing process, a grinding process such as a chemical mechanical polishing (CMP) process, an etch-back process, or a combination thereof may be used. For example, the semiconductor wafer 300W may have a reduced thickness by performing a grinding process, and the dummy electrodes 330 may be sufficiently exposed by applying an etch-back under appropriate conditions.

Referring to FIG. 9C, an insulating protective film 303 and lower dummy bumps 306 may be formed on the semiconductor wafer 300W in sequence to cover the exposed upper ends T of the dummy electrodes 330. The insulating protective film 303 may be formed as an insulating layer such as a silicon oxide film, a silicon nitride film, or a silicon oxynitride film. The lower dummy bumps 306 may be formed by plating a metal such as aluminum (Al) or copper (Cu) on the insulating protective film 303. Through the above-described processes, the semiconductor wafer 300W may include a plurality of dummy chips 300 isolated from each other by a scribe line SL. The dummy chips 300 may have a cool zone CZ in which the dummy electrodes 330 are not disposed.

Figure 10A:
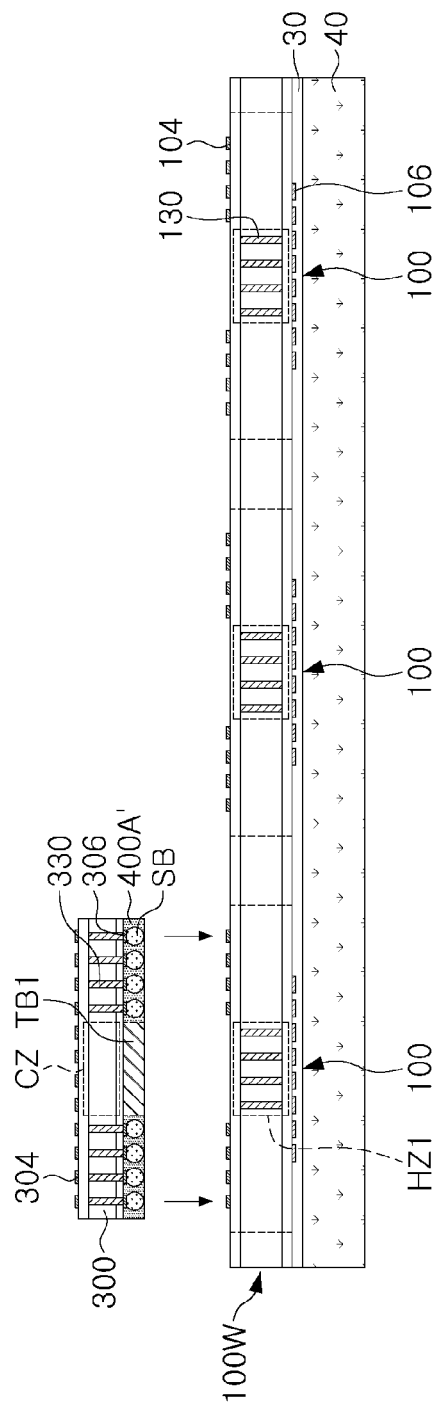
FIGS. 10A to 10C are cross-sectional diagrams illustrating a method of manufacturing a semiconductor package according to an example embodiment of the present disclosure.
Figure 10B:
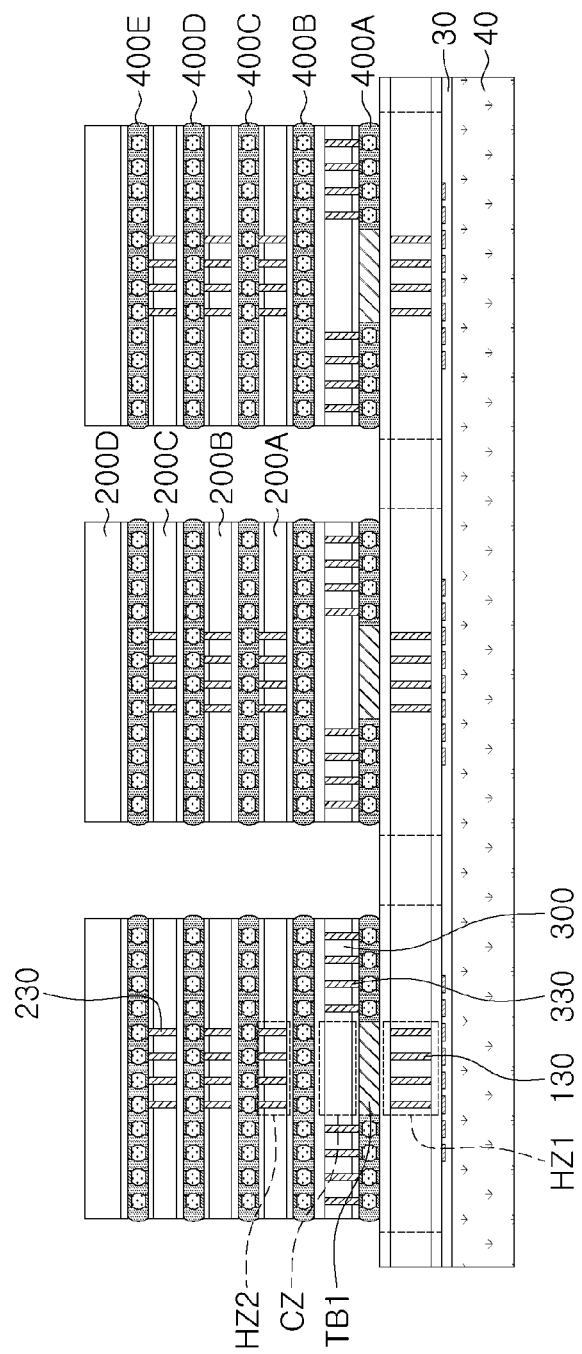
Figure 10C:
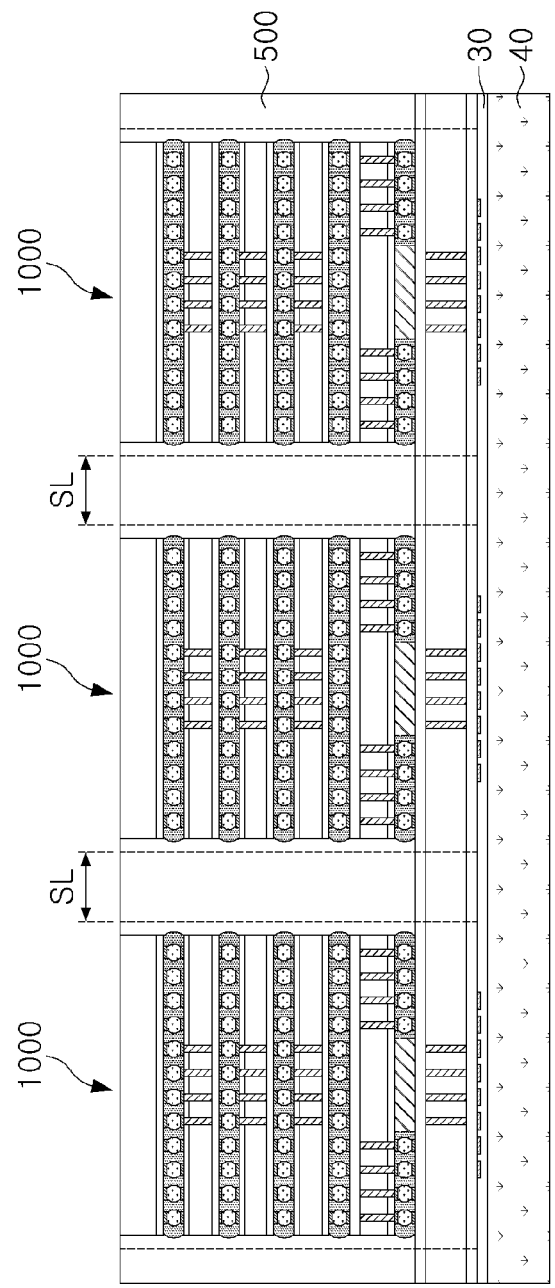

FIGS. 10A to 10C are cross-sectional diagrams illustrating a method of manufacturing a semiconductor package according to an example embodiment.

Referring to FIG. 10A, a semiconductor wafer 100W for the first semiconductor chips 100 having the first hot zone HZ1 in which the first through electrodes 130 are densely disposed may be attached to a carrier 30 using an adhesive material layer 40. The semiconductor wafer 100W may be in a state in which components for the first semiconductor chips 100 are implemented.

Thereafter, a first adhesive film layer 400A' may be formed on one surface of the dummy chip 300 manufactured through the processes in FIGS. 9A to 9C. The dummy chip 300 may have a cool zone CZ in which the dummy electrodes 330 are not disposed. The first adhesive film layer 400A' may include a first thermal barrier layer TB1 formed in a position corresponding to the cool zone CZ of the dummy chip 300. The first adhesive film layer 400A' may be formed using, for example, NCF, and the first thermal barrier layer TB1 may be a region having have thermal conductivity of about 0.5 W/mK or less by impregnating a filler such as silica in the NCF.

Thereafter, the dummy chip 300 may be attached to the semiconductor wafer 100W. The dummy chip 300 may be disposed such that the cool zone CZ in the first adhesive film layer 400A' may overlap the first hot zone HZ1 of the first semiconductor chip 100 in the stacking direction. Through a thermal compression process, the lower dummy bumps 306 of the dummy chip 330 may be bonded to the upper bumps 104 of the first semiconductor chip 100 through the solder balls SB.

Referring to FIG. 10B, second semiconductor chips 200A, 200B, 200C, and 200D may be stacked in order on the dummy chip 300. The second semiconductor chips 200A, 200B, 200C, and 200D may be attached to the dummy chip 300 such that the second hot zone HZ2 may overlap the cool zone CZ in the stacking direction after a second adhesive film layer is formed on the lower surface of the second semiconductor chip, that is, for example, the lowermost second semiconductor chip 200A. The dummy electrodes 330 of the dummy chip 300 may not overlap the first and second hot zones HZ1 and HZ2 in the stacking direction, and accordingly, the first through electrodes 130 of the first semiconductor chip 100 may be bypass the cool zone CZ through the dummy electrodes 330 and may be electrically connected to the second through electrodes 23.

Referring to FIG. 10C, an encapsulant 500 may be formed on the semiconductor wafer 100W. The upper surface of the encapsulant 500 may be planarized by a polishing process. For example, the encapsulant 500 may cover a side surface of each of the adhesive films 400A, 400B, 400C, 400D, and 400E, a side surface of the dummy chip 300, and at least a portion of side surfaces of each of the second semiconductor chips 200A, 200B, 200C, and 200D, and may expose the upper surface of the uppermost second semiconductor chip 200D. As the polishing process, a CMP process may be performed, for example. Thereafter, the encapsulant 500 and the semiconductor wafer 100W may be cut along the scribe line SL and the plurality of semiconductor packages 100 may be separated from each other.

FIGS. 11A to 11D are cross-sectional diagrams illustrating a process of manufacturing a first semiconductor chip 100 illustrated in FIGS. 7A and 7B, illustrating a process of manufacturing a lower thermal barrier layer TB1a of the first semiconductor chip 100 illustrated in FIG. 7B.

Figure 11A:
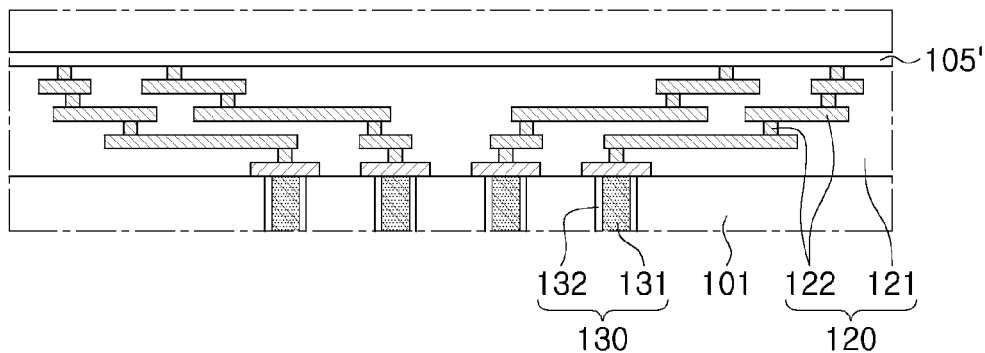
FIGS. 11A to 11D are cross-sectional diagrams illustrating a process of manufacturing a first semiconductor chip illustrated in FIGS. 7A and 7B, according to an example embodiment of the present disclosure.

Referring to FIG. 11A, a preliminary passivation layer 105' may be formed on a first wiring structure 120. The preliminary passivation layer 105' may include or be formed of, for example, silicon oxide (SiO) or silicon carbonitride (SiCN). The first wiring layer 122 of the first wiring structure 120 may include a landing pad in contact with the first through electrode 130, and an insulating protective layer (not illustrated) electrically insulating the landing pad from the first substrate 101 may be disposed between the landing pad and the first substrate 101.

Figure 11B:
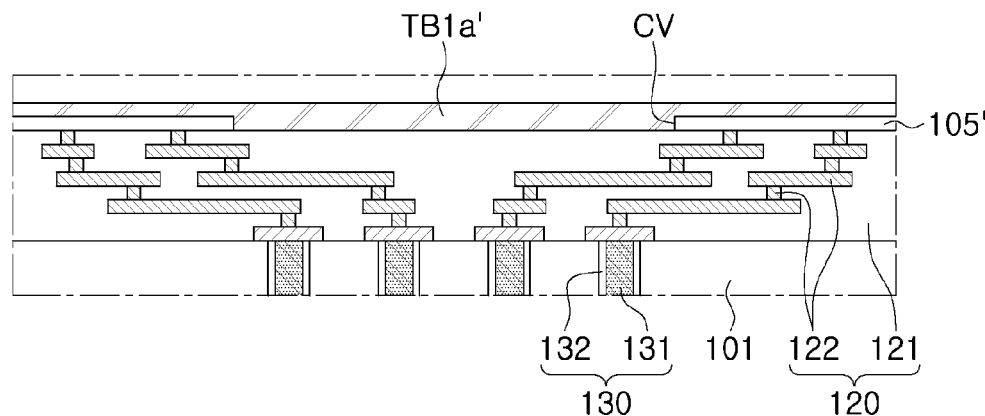

Referring to FIG. 11B, a preliminary thermal barrier layer TB1a' may be formed in a cavity CV of the preliminary passivation layer 105'. The cavity CV may be formed by performing a photolithography process using a photosensitive material (e.g., photoresist) and an etching process using a photosensitive insulating material patterned through the photolithography process. The preliminary thermal barrier layer TB1a' may be formed by filling the cavity CV with PSPI. Thereafter, the preliminary thermal barrier layer TB1a' may be planarized by a CMP process. The preliminary thermal barrier layer TB1a' may be formed of an insulating material having thermal conductivity of about 0.5 W/mK or less.

Figure 11C:
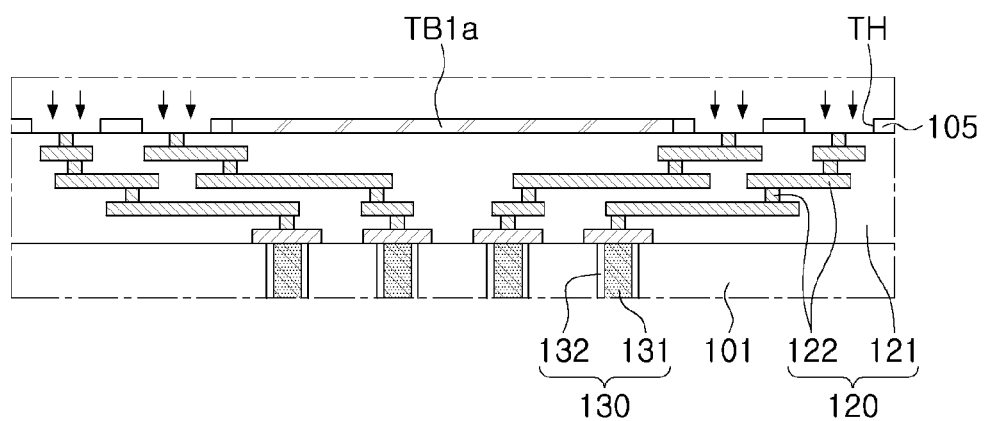

Referring to FIG. 11C, the upper passivation layer 105 in which the through hole TH is formed may be formed. The through hole TH may be formed through a photolithography process and an etching process. The through hole TH may be formed to expose a portion of the first wiring layer 122. Thereafter, a metal layer (not illustrated) may be formed on the upper passivation layer 105 by a plating process. The metal layer (not illustrated) may include, for example, copper (Cu).

Figure 11D:
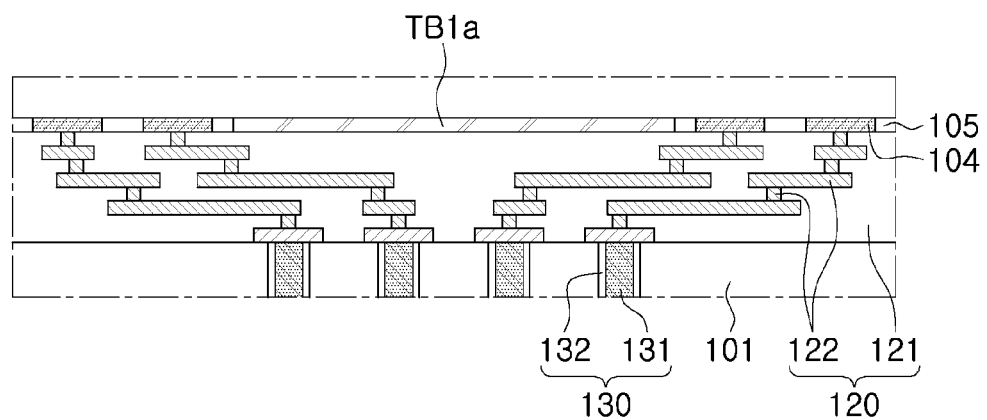

Referring to FIG. 11D, an upper bump 104 surrounded by an upper passivation layer 105 may be formed. The upper bump 104 may be formed by planarizing the metal layer (not illustrated) using a CMP process. The upper bump 104 is illustrated as a single layer, but the upper bump 104 may include two or more layers in example embodiments. Through a process similar to the process described in the aforementioned example embodiment, the upper thermal barrier layer TB1b, the lower dummy bumps 306, and the lower bonding layer 307 of the dummy chip 300 in FIG. 7B may be formed.

According to the aforementioned example embodiments, by disposing a dummy chip blocking a heat flow between the semiconductor chips, a semiconductor package having improved heat dissipation properties may be provided.

While the example embodiments have been illustrated and described above, it will be apparent to those skilled in the art that modifications and variations could be made without departing from the scope of the present disclosure as defined by the appended claims.

What is claimed is:

1. A semiconductor package, comprising:
    a first semiconductor chip including first through electrodes and having a first hot zone in which the first through electrodes are disposed;
    a heat redistribution chip disposed on the first semiconductor chip, having a cool zone overlapping the first hot zone in a stacking direction with respect to the first semiconductor chip, and including first heat redistribution through electrodes disposed outside of an outer boundary of the cool zone and electrically connected to the first through electrodes, respectively;
    a second semiconductor chip disposed on the heat redistribution chip, having a second hot zone overlapping the cool zone in the stacking direction, and including second through electrodes disposed in the second hot zone and electrically connected to the first heat redistribution through electrodes, respectively; and
    a first thermal barrier layer disposed between the first hot zone and the cool zone, wherein the first through electrodes are electrically connected to the second through electrodes by bypassing the cool zone via the first heat redistribution through electrodes.

2. The semiconductor package of claim 1, wherein the first heat redistribution through electrodes do not overlap the first and second hot zones in the stacking direction.

3. The semiconductor package of claim 1, wherein the first semiconductor chip includes a first substrate penetrated by the first through electrodes, first upper bumps disposed to be shifted horizontally from the first hot zone on the first substrate, and a first wiring layer disposed between the first substrate and the first upper bumps and electrically connecting the first through electrodes to the first upper bumps.

4. The semiconductor package of claim 3, wherein the first upper bumps are spaced apart from the first thermal barrier layer.

5. The semiconductor package of claim 3,
wherein the heat redistribution chip further includes lower heat redistribution bumps electrically connected to the first heat redistribution through electrodes below the first heat redistribution through electrodes, and
wherein the lower heat redistribution bumps are electrically connected to the first upper bumps.

6. The semiconductor package of claim 1, wherein the heat redistribution chip further includes a substrate penetrated by the first heat redistribution through electrodes, upper heat redistribution bumps overlapping the cool zone in the stacking direction on the substrate, and a redistribution layer disposed on the substrate and electrically connecting the first heat redistribution through electrodes to the upper heat redistribution bumps.

7. The semiconductor package of claim 1, further comprising:
a first adhesive film filling a region between the first semiconductor chip and the heat redistribution chip,
wherein the first thermal barrier layer is a region in which a filler is impregnated in the first adhesive film.

8. The semiconductor package of claim 7, wherein the filler includes silica.

9. The semiconductor package of claim 1,
wherein the first semiconductor chip further includes first upper bumps shifted from the first hot zone and an upper passivation layer surrounding the first upper bumps,
wherein the heat redistribution chip further includes lower heat redistribution bumps disposed below the first heat redistribution through electrodes contacting the first upper bumps, and a lower bonding layer surrounding the lower heat redistribution bumps and contacting the upper passivation layer, and
wherein the first thermal barrier layer is surrounded by the upper passivation layer or the lower bonding layer.

10. The semiconductor package of claim 9, wherein the first thermal barrier layer includes a material having thermal conductivity lower than thermal conductivity of the upper passivation layer and the lower bonding layer.

11. The semiconductor package of claim 1, wherein the first thermal barrier layer has thermal conductivity of about 0.5 W/mK or less.

12. The semiconductor package of claim 1, further comprising:
a second thermal barrier layer disposed between the second hot zone and the cool zone.

13. The semiconductor package of claim 12, wherein the second semiconductor chip includes a second substrate penetrated by the second through electrodes, second lower bumps disposed to be horizontally shifted from the second hot zone and disposed in the stacking direction below the second substrate, and a second wiring layer disposed between the second substrate and the second lower bumps and electrically connecting the second through electrodes to the second lower bumps.

14. The semiconductor package of claim 1, wherein the heat redistribution chip further includes a heat dissipation layer extending from a periphery of the cool zone to an edge of the heat redistribution chip and electrically insulated from the first heat redistribution through electrodes.

15. The semiconductor package of claim 1,
wherein the first hot zone is disposed in a center of the first semiconductor chip, and
wherein the first through electrodes are densely disposed in the first hot zone.

\* \* \* \* \*